(12) United States Patent
Ikenaga

(10) Patent No.: US 10,991,883 B2
(45) Date of Patent: Apr. 27, 2021

(54) DEPOSITION MASK, METHOD OF MANUFACTURING DEPOSITION MASK DEVICE, AND METHOD OF MANUFACTURING DEPOSITION MASK

(71) Applicant: Dai Nippon Printing Co., Ltd., Tokyo (JP)

(72) Inventor: Chikao Ikenaga, Tokyo (JP)

(73) Assignee: Dai Nippon Printing Co., Ltd., Tokyo (JP)

(*) Notice: Subject to any disclaimer, the term of this patent is extended or adjusted under 35 U.S.C. 154(b) by 24 days.

(21) Appl. No.: 16/096,480

(22) PCT Filed: Dec. 26, 2017

(86) PCT No.: PCT/JP2017/046751
§ 371 (c)(1),
(2) Date: Oct. 25, 2018

(87) PCT Pub. No.: WO2018/131474
PCT Pub. Date: Jul. 19, 2018

(65) Prior Publication Data
US 2019/0140178 A1    May 9, 2019

(30) Foreign Application Priority Data

Jan. 10, 2017 (JP) .............................. JP2017-002157
Dec. 12, 2017 (JP) .............................. JP2017-238092

(51) Int. Cl.
*C23C 14/04* (2006.01)
*H01L 51/00* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC .... C23C 14/042; C23C 16/042; H01L 51/011
See application file for complete search history.

(56) References Cited

U.S. PATENT DOCUMENTS 5,534,969 A * 7/1996 Miyake .................. G03F 7/707
250/559.3
2009/0311427 A1* 12/2009 Marcanio .............. C23C 14/042
118/50
(Continued)

FOREIGN PATENT DOCUMENTS

EP    1 426 461 A1    6/2004
JP    2001-234385 A1    8/2001
(Continued)

OTHER PUBLICATIONS

English translation of International Preliminary Report on Patentability (Chapter I) (Application No. PCT/JP2017/046751) dated Jul. 25, 2019, 8 pages.
(Continued)

*Primary Examiner* — Binu Thomas
(74) *Attorney, Agent, or Firm* — Burr & Brown, PLLC

(57) ABSTRACT

A deposition mask has a central axis extending in a first direction, arranged at a central position in a second direction orthogonal to the first direction. Spaced apart point P1 and Q1 are provided on one side of the central axis, and spaced apart points Q1 and Q2 are provided on another side of the central axis. When a dimension from point P1 to point Q1 is X1, a dimension from point P2 to a point Q2 is X2, and a design value is $\alpha_x$, the deposition mask satisfies the following.

$$\left| \alpha_X - \frac{X1 + X2}{2} \right| \le 40 \ \mu m \qquad \text{[Formula 1]}$$

and $$|X1 - X2| \le 60 \ \mu m \qquad \text{[Formula 2]}$$

3 Claims, 15 Drawing Sheets

(51) Int. Cl.
*C23C 14/12* (2006.01)
*C23F 1/02* (2006.01)
*C23C 14/24* (2006.01)
*H01L 51/56* (2006.01)

(52) U.S. Cl.
CPC .............. *C23C 14/24* (2013.01); *C23F 1/02* (2013.01); *H01L 51/001* (2013.01); *H01L 51/56* (2013.01)

(56) References Cited

U.S. PATENT DOCUMENTS

| | | | |
|---|---|---|---|
| 2011/0171768 A1* | 7/2011 | Hong | C23C 14/042 118/504 |
| 2012/0240850 A1* | 9/2012 | Kobayashi | C23C 14/042 118/504 |
| 2014/0147949 A1* | 5/2014 | Hong | C23C 14/042 438/46 |
| 2015/0328662 A1* | 11/2015 | Mizumura | C23C 14/04 425/174.4 |
| 2016/0208392 A1* | 7/2016 | Ikenaga | C23C 14/021 |
| 2016/0237546 A1 | 8/2016 | Ikenaga et al. | |
| 2016/0293844 A1* | 10/2016 | Takeda | C23C 14/042 |
| 2017/0141315 A1* | 5/2017 | Ikenaga | C23C 14/042 |
| 2018/0083193 A1* | 3/2018 | Kim | H01L 51/0011 |

FOREIGN PATENT DOCUMENTS

| | | |
|---|---|---|
| JP | 5382259 B1 | 1/2014 |
| JP | 2014-148743 A1 | 8/2014 |
| JP | 2016-053192 A1 | 4/2016 |

OTHER PUBLICATIONS

Korean Office Action (Application No. 10-2018-7031082) dated Mar. 24, 2020.
Japanese Office Action (Application No. 2017-238092) dated Apr. 27, 2018 (with English translation).
Japanese Office Action (Application No. 2018-138764) dated Aug. 17, 2018 (with English translation).
International Search Report and Written Opinion (Application No. PCT/JP2017/046751) dated Feb. 13, 2018.
Taiwanese Office Action (Application No. 109105393) dated Nov. 19, 2020 (with English translation).
Extended European Search Report (Application No. 17891878.5) dated Oct. 12, 2020.
Korean Office Action (Application No. 10-2020-7030539) dated Jan. 4, 2021 (with English translation).
English translation of the International Preliminary Report on Patentability (Chapter 1)(Application No. PCT/JP2019/023374) dated Jan. 21, 2021.

* cited by examiner

| SAMPLE | αx-X1 [μm] | αx-X2 [μm] | \|αx-(X1+X2)/2\| THRESHOLD:40μm | αy-Y1 THRESHOLD:±40μm | DETERMINATION RESULT OF FORMULA (1) | \|X1-X2\| THRESHOLD:60μm | Y2 THRESHOLD:3.0μm | DETERMINATION RESULT OF FORMULA (2) | OVERALL DETERMINATION RESULT |
|---|---|---|---|---|---|---|---|---|---|
| 1 | -40.2 | 19.3 | 10.5 | 3.9 | OK | 59.5 | 2.7 | OK | OK |
| 2 | -14.3 | -11.9 | 13.1 | 3.8 | OK | 2.4 | 0.1 | OK | OK |
| 3 | 6.1 | -23.4 | 8.7 | 3.1 | OK | 29.5 | 0.9 | OK | OK |
| 4 | 17.9 | 39.5 | 28.7 | -3.8 | OK | 21.6 | 0.8 | OK | OK |
| 5 | 39.5 | 40.4 | 40.0 | -3.9 | OK | 0.9 | 0.1 | OK | OK |
| 6 | 39.2 | -20.8 | 9.2 | -0.4 | OK | 60.0 | 3.0 | NG | NG |
| 7 | -40.6 | 24.3 | 8.2 | 3.0 | OK | 64.9 | 3.2 | NG | NG |
| 8 | -26.2 | 38.7 | 6.3 | -0.4 | OK | 64.9 | 3.3 | NG | NG |
| 9 | 25.5 | -38.8 | 6.7 | 2.7 | OK | 64.3 | 3.1 | NG | NG |
| 10 | 40.2 | -24.6 | 7.8 | 0.2 | OK | 64.8 | 3.3 | NG | NG |
| 11 | -78.1 | -34.4 | 56.3 | 11.6 | NG | 43.7 | 2.2 | OK | NG |
| 12 | -51.3 | -32.2 | 41.8 | 9.0 | NG | 19.1 | 1.9 | OK | NG |
| 13 | -41.9 | -52.3 | 47.1 | 9.9 | NG | 10.4 | 2.5 | OK | NG |
| 14 | 42.5 | 56.2 | 49.4 | -7.6 | NG | 13.7 | 0.5 | OK | NG |
| 15 | 53.7 | 40.1 | 46.9 | -7.1 | NG | 13.6 | 2.4 | OK | NG |
| 16 | 79.5 | 19.5 | 49.5 | -7.6 | NG | 60.0 | 2.9 | OK | NG |
| 17 | -78.9 | -3.5 | 41.2 | 8.9 | NG | 75.4 | 3.1 | NG | NG |
| 18 | -96.3 | 12.2 | 42.1 | 9.0 | NG | 108.5 | 3.5 | NG | NG |
| 19 | 92.6 | 31.6 | 62.1 | -9.8 | NG | 61.0 | 3.2 | NG | NG |
| 20 | 78.2 | 3.1 | 40.7 | -6.0 | NG | 75.1 | 3.3 | NG | NG |
| 21 | -69.3 | -10.2 | 39.8 | -3.8 | OK | 59.1 | 2.9 | OK | OK |
| 22 | -68.4 | -8.3 | 38.4 | -3.7 | OK | 60.1 | 3.3 | NG | NG |
| 23 | 10.3 | 70.2 | 40.3 | -4.1 | NG | 59.9 | 2.9 | OK | NG |
| 24 | 9.1 | 69.8 | 39.5 | -4.0 | OK | 60.7 | 3.3 | NG | NG |
| 25 | 8.3 | 70.1 | 39.2 | -3.9 | OK | 61.8 | 3.3 | NG | NG |

FIG. 29

DEPOSITION MASK, METHOD OF MANUFACTURING DEPOSITION MASK DEVICE, AND METHOD OF MANUFACTURING DEPOSITION MASK

TECHNICAL FIELD

The present invention relates to a deposition mask, a method of manufacturing a deposition mask device, and a method of manufacturing a deposition mask.

BACKGROUND ART

In recent years, it is required for display devices used in portable devices, such as a smartphone and a tablet PC, to have high definition, for example, a pixel density of 500 ppi or higher. In addition, there is an increasing demand for adapting to ultra-high definition even with respect to the portable devices. In this case, it is required for the display devices to have a pixel density of, for example, 800 ppi or higher.

Among the display devices, an organic EL display device has drawn attention due to good responsiveness, low power consumption, and high contrast. As a method of forming pixels of the organic EL display device, a method of forming pixels in a desired pattern using a deposition mask in which through-holes, arranged in a desired pattern, are formed is known. Specifically, first, the deposition mask is brought into close contact with a substrate for the organic EL display device, and then, a deposition step of introducing both the deposition mask and the substrate, in close contact with each other, into the deposition device to cause an organic material to be deposited on the substrate. In this case, it is required to precisely reproduce a position and a shape of the through-hole of the deposition mask in accordance with a design in order to precisely prepare the organic EL display device having a high pixel density.

As a method of manufacturing the deposition mask, a method of forming a through-hole in a metal plate by etching using a photolithography technique is known, for example, as disclosed in Patent Literature 1. For example, a first resist pattern is first formed on a first surface of the metal plate by exposure and development processing, and a second resist pattern is formed on a second surface of the metal plate by exposure and development processing. Next, a region of the first surface of the metal plate that is not covered with the first resist pattern is etched to form a first opening on the first surface of the metal plate. Thereafter, a region of the second surface of the metal plate that is not covered with the second resist pattern is etched to form a second opening on the second surface of the metal plate. At this time, it is possible to form the through-hole penetrating the metal plate by performing etching such that the first opening and the second opening communicate with each other. The metal plate for production of the deposition mask is obtained, for example, by rolling a base material such as an iron alloy.

In addition, as the method of manufacturing the deposition mask, a method of manufacturing a deposition mask using plating is known, for example, as disclosed in Patent Literature 2. For example, a base material having conductivity is produced first in the method described in Patent Literature 2. Next, resist patterns arranged with a predetermined gap are formed on the base material by exposure and development processing. This resist pattern is provided at positions where through-holes of the deposition mask need to be formed. Thereafter, a plating solution is supplied to the gap of the resist pattern to precipitate a metal layer on the base material by an electrolytic plating process. Thereafter, the deposition mask having the plurality of through-holes formed therein can be obtained by separating the metal layer from the base material.

CITATION LIST

Patent Literature

Patent Literature 1: JP 5382259 B2
Patent Literature 2: JP 2001-234385 A

DISCLOSURE OF THE INVENTION

When deposition materials are deposited on a substrate using a deposition mask, the deposition material adheres not only to the substrate but also to the deposition mask. For example, some of the deposition materials are directed toward the substrate along a direction which is greatly inclined with respect to the normal direction of the deposition mask, such deposition materials reach and adhere to a wall surface of the through-hole of the deposition mask before reaching the substrate. In this case, it is conceivable that the deposition material hardly adheres to a region of the substrate located in the vicinity of the wall surface of the through-hole of the deposition mask, and as a result, a thickness of the adhering deposition material becomes smaller than that in the other portion or a portion where the deposition material does not adhere is generated. That is, it is conceivable that deposition in the vicinity of the wall surface of the through-hole of the deposition mask becomes unstable. Therefore, when the deposition mask is used to form a pixel of an organic EL display device, dimensional accuracy and positional accuracy of the pixel deteriorate, and as a result, luminous efficiency of the organic EL display device deteriorates.

In order to solve such a problem, it is conceivable to reduce the thickness of the metal plate used to manufacture the deposition mask. This is because it is possible to reduce the height of the wall surface of the through-hole of the deposition mask by lowering the thickness of the metal plate and to reduce the proportion of the deposition materials adhering to the wall surface of the through-hole.

A rolled material obtained by rolling a base material to a predetermined thickness is used for the metal plate used to manufacture the deposition mask in some cases. In order to reduce the thickness of such a metal plate, it is necessary to increase a rolling ratio of the metal plate. Here, the rolling ratio is a value calculated from (Thickness of Base Material−Thickness of Metal Plate)/(Thickness of Base Material). However, an elongation ratio of the metal plate varies depending on a position in a width direction (a direction orthogonal to a conveying direction of the base material). As the rolling ratio increases, the degree of unevenness of deformation due to rolling may increase. Thus, it is known that a corrugated shape appears on a metal plate that has been rolled at a large rolling ratio. Specifically, there is a corrugated shape formed at a side edge of the metal plate in the width direction, which is called ear portion elongation. Further, there is a corrugated shape formed at the center of the metal plate in the width direction, which is called middle elongation. Such a corrugated shape may appear even when heat treatment such as annealing is performed after rolling.

In addition, there is also a case where a metal plate having a predetermined thickness is produced by a foil manufacturing step using plating. However, if the current density is uneven in the foil manufacturing step, the thickness of the metal plate to be produced may be non-uniform. As a result, there is a possibility that similar corrugated shapes appear on side edges of the metal plate in the width direction.

When the deposition mask is produced using the metal plate having the corrugated shape as described above and then stretched, the elongation of the deposition mask varies in the width direction, which may cause deviation of a position of the through-hole in some cases. More specifically, a portion of the metal plate with a large corrugated shape has a longer dimension in the longitudinal direction than a portion with a small corrugated shape when formed as the deposition mask. Here, it is assumed a case where a deposition mask is stretched by applying a tensile force to a first position portion and a second position portion which are different from each other in the width direction. In this case, if a length in the longitudinal direction of the deposition mask in the first position portion is shorter than a length in the longitudinal direction thereof in the second position portion, the tensile force is applied to the deposition mask such that the length in the longitudinal direction of the first position portion is equal to the length in the longitudinal direction of the second position portion. Thus, there is a possibility that the first position portion extends more than the second position portion and a central portion of the deposition mask in the longitudinal direction deviates toward the first position portion in the width direction. In this case, there is a possibility that the position of the through-hole at the time of stretching deviate.

When the position of the through-hole of the deposition mask at the time of stretching deviates in this manner, the position of the deposition material deposited on the substrate via the through-hole deviates, and there is a risk that the dimensional accuracy and the positional accuracy of the pixel of the organic EL display device may deteriorate.

The present invention has been made in consideration of such problems, and an object thereof is to provide a deposition mask, a method of manufacturing a deposition mask device, and a method of manufacturing a deposition mask capable of improving positional accuracy of a through-hole at the time of stretching.

The present invention provides a deposition mask extending in a first direction. The deposition mask including:

a central axis line extending in the first direction and arranged at a central position in a second direction orthogonal to the first direction;

a point P1 and a point Q1 provided on one side of the central axis line and spaced apart from each other along the first direction; and a point P2 and a point Q2 provided on the other side of the central axis line and spaced apart from each other along the first direction.

The point P1 and the point P2 are intended to be arranged to be symmetric with each other with respect to the central axis line during deposition.

The point Q1 and the point Q2 are intended to be arranged to be symmetric with each other with respect to the central axis line during deposition.

When a dimension from the point P1 to the point Q1 is X1, a dimension from the point P2 to the point Q2 is X2, and a predetermined value is $\alpha_X$, the deposition mask satisfies the following.

$$\left| \alpha_X - \frac{X1 + X2}{2} \right| \leq 40 \ \mu m \quad \text{[Formula 1]}$$

$$|X1 - X2| \leq 60 \ \mu m \quad \text{[Formula 2]}$$

The deposition mask according to the present invention may further include: a first ear portion and a second ear portion that form a pair of end portions in the first direction; and a plurality of through-holes provided between the first ear portion and the second ear portion and through which a deposition material passes during deposition.

The point P1 and the point P2 may be positioned at center points of corresponding through-holes among the through-holes formed on a side of the first ear portion.

The point Q1 and the point Q2 may be positioned at center points of corresponding through-holes among the through-holes formed on a side of the second ear portion.

In the deposition mask according to the present invention, a plurality of effective regions in which the through-holes are formed may be provided between the first ear portion and the second ear portion.

The plurality of effective regions may include a first effective region and a second effective region arranged along the first direction of the deposition mask.

The first effective region may be arranged on the side of the first ear portion, the second effective region is arranged on the side of the second ear portion.

The point P1 and the point P2 may be positioned at the center points of the corresponding through-holes formed in the first effective region.

The point Q1 and the point Q2 may be positioned at the center points of the corresponding through-holes formed in the second effective region.

In the deposition mask according to the present invention, the first effective region may be arranged on a side closest to the first ear portion among the plurality of effective regions, and the second effective region may be arranged on a side closest to the second ear portion among the plurality of effective regions.

In the deposition mask according to the present invention, the through-holes corresponding to the point P1 and the point P2 may be formed on a side closest to the first ear portion among the plurality of through-holes, and the through-holes corresponding to the point Q1 and point Q2 may be formed on a side closest to the second ear portion among the plurality of through-holes.

The present invention provides a method of manufacturing a deposition mask device including:

preparing the above-described deposition mask; and applying a tension in the first direction to the deposition mask so that the deposition mask is stretched to be installed to a frame.

The present invention provides a deposition method including:

a step of preparing the deposition mask device by the above-described method of manufacturing the deposition mask device;

a step of bringing the deposition mask of the deposition mask device into close contact with a substrate; and a step of depositing a deposition material on the substrate through the through-hole of the deposition mask.

The present invention provides a method of manufacturing a deposition mask, the deposition mask extending in a first direction and including: a central axis line extending in the first direction and arranged at a central position in a second direction orthogonal to the first direction; a point P1 and a point Q1 provided on one side of the central axis line and spaced apart from each other along the first direction; and a point P2 and a point Q2 provided on the other side of the central axis line and spaced apart from each other along the first direction. The point P1 and the point P2 are intended to be arranged to be symmetric with each other with respect to the central axis line during deposition. The point Q1 and the point Q2 are intended to be arranged to be symmetric with each other with respect to the central axis line during deposition. The method comprises:

producing the deposition mask;

measuring a dimension X1 from the point P1 to the point Q1 and a dimension X2 from the point P2 to the point Q2; and determining whether the dimension X1 and the dimension X2, measured in the measuring, satisfy $$\left|\alpha_X - \frac{X1+X2}{2}\right| \leq 40 \ \mu m \quad \text{[Formula 3]}$$

$$|X1 - X2| \leq 60 \ \mu m \quad \text{[Formula 4]}$$

when a predetermined value is $\alpha_X$.

According to the present invention, it is possible to improve the positional accuracy of the through-hole when stretched.

BRIEF DESCRIPTION OF DRAWINGS

FIG. 29 is a view illustrating a quality determination result of the deposition mask.

DESCRIPTION OF EMBODIMENTS

Figure 1:
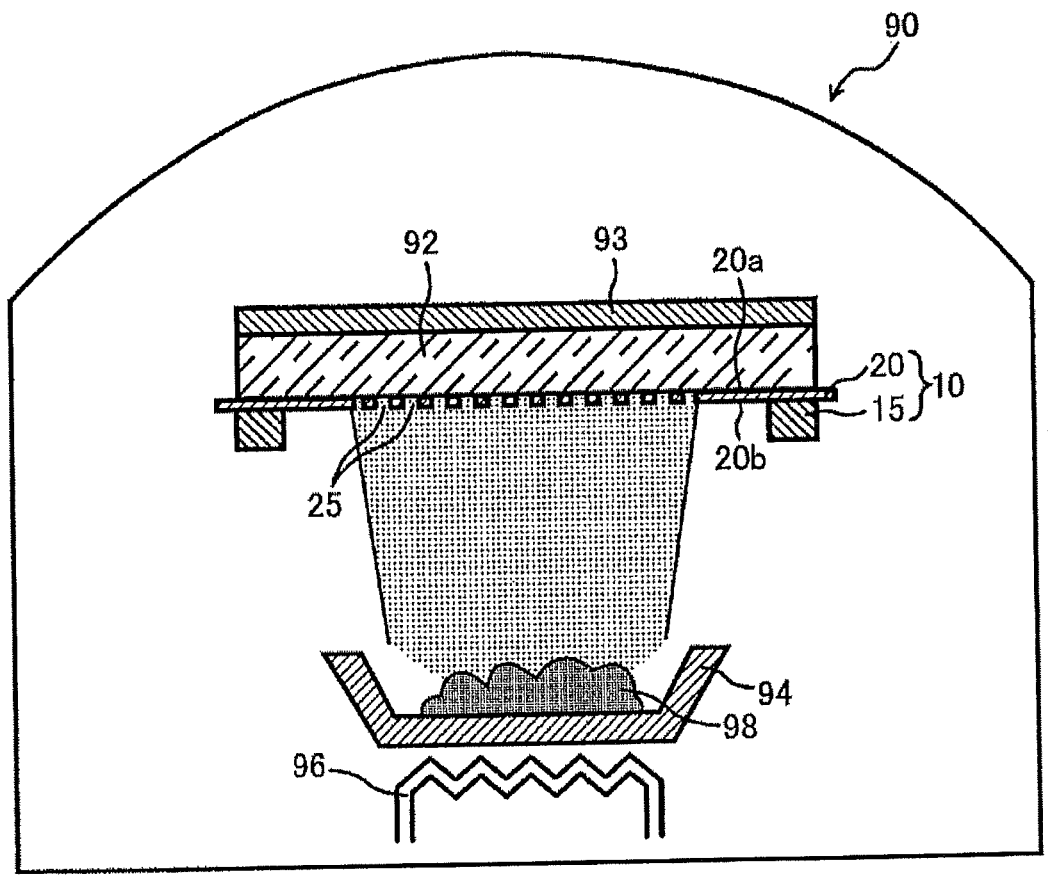
FIG. 1 is a view illustrating a deposition device including a deposition mask device according to an embodiment of the present invention.

Hereinafter, an embodiment of the present invention will be described with reference to the drawings. Incidentally, in the drawings appended to the specification of the present application, scales and horizontal and vertical dimension ratios are appropriately changed and exaggerated as compared to actual ones thereof in order for convenience of illustration and facilitating the understanding.

FIGS. 1 to 28 are views for describing an embodiment of the present invention. In the following embodiment and modifications thereof, a description will be given by exemplifying a method of manufacturing a deposition mask used for patterning of an organic material in a desired pattern on a substrate when manufacturing an organic EL display device. However, the present invention is not limited to such applications but can be applied to deposition masks used for various purposes.

Incidentally, in the present specification, the terms "plate", "sheet", and "film" are not distinguished from each other based solely on differences in nomenclature. For example, the "plate" is a concept that also includes a member which can be called a sheet or a film.

In addition, the "plate plane (a sheet plane or a film plane)" indicates a surface that coincides with a plane direction of a target plate-like member (a sheet-like member or a film-like member) in a case where the target plate-like (sheet-like or film-like) member is viewed widely as a whole. In addition, a normal direction used with respect to the plate-like (sheet-like or film-like) member indicates a normal direction with respect to the plate plane (the sheet plane or the film plane) of the member.

In addition, terms, lengths, angles, and values of physical characteristics specifying shapes, geometric conditions, physical characteristics, and extent thereof used in the present specification (for example, the terms such as "parallel", "orthogonal", "same", and "equivalent") are interpreted including a range of extent where similar functions can be expected without being bound by strict meaning.

(Deposition Device)

First, a deposition device 90 that performs a deposition process to deposit a deposition material on an object will be described with reference to FIG. 1. As illustrated in FIG. 1, the deposition device 90 includes a deposition source (for example, a crucible 94), a heater 96, and a deposition mask device 10 therein. In addition, the deposition device 90 further includes an exhaust means for setting the interior of the deposition device 90 into a vacuum atmosphere. The crucible 94 contains a deposition material 98 such as an organic light-emitting material. The heater 96 heats the crucible 94 to evaporate the deposition material 98 under the vacuum atmosphere. The deposition mask device 10 is arranged to face the crucible 94.

(Deposition Mask Device)

Hereinafter, the deposition mask device 10 will be described. As illustrated in FIG. 1, the deposition mask device 10 includes a deposition mask 20 and a frame 15 supporting the deposition mask 20. The frame 15 supports the deposition mask 20 in the state of being pulled in its plane direction such that the deposition mask 20 is not deflected. As illustrated in FIG. 1, the deposition mask device 10 is arranged inside the deposition device 90 such that the deposition mask 20 faces a substrate which is an object to which the deposition material 98 is attached, for example, an organic EL substrate 92. In the following description, a surface of the deposition mask 20 on the organic EL substrate 92 side is referred to as a first surface 20a, and a surface on the opposite side of the first surface 20a is referred to as a second surface 20b.

As illustrated in FIG. 1, the deposition mask device 10 may include a magnet 93 arranged on a surface of the organic EL substrate 92 on the opposite side of the deposition mask 20. Since the magnet 93 is provided, the deposition mask 20 can be brought into close contact with the organic EL substrate 92 by attracting the deposition mask 20 to the magnet 93 side by a magnetic force.

Figure 3:
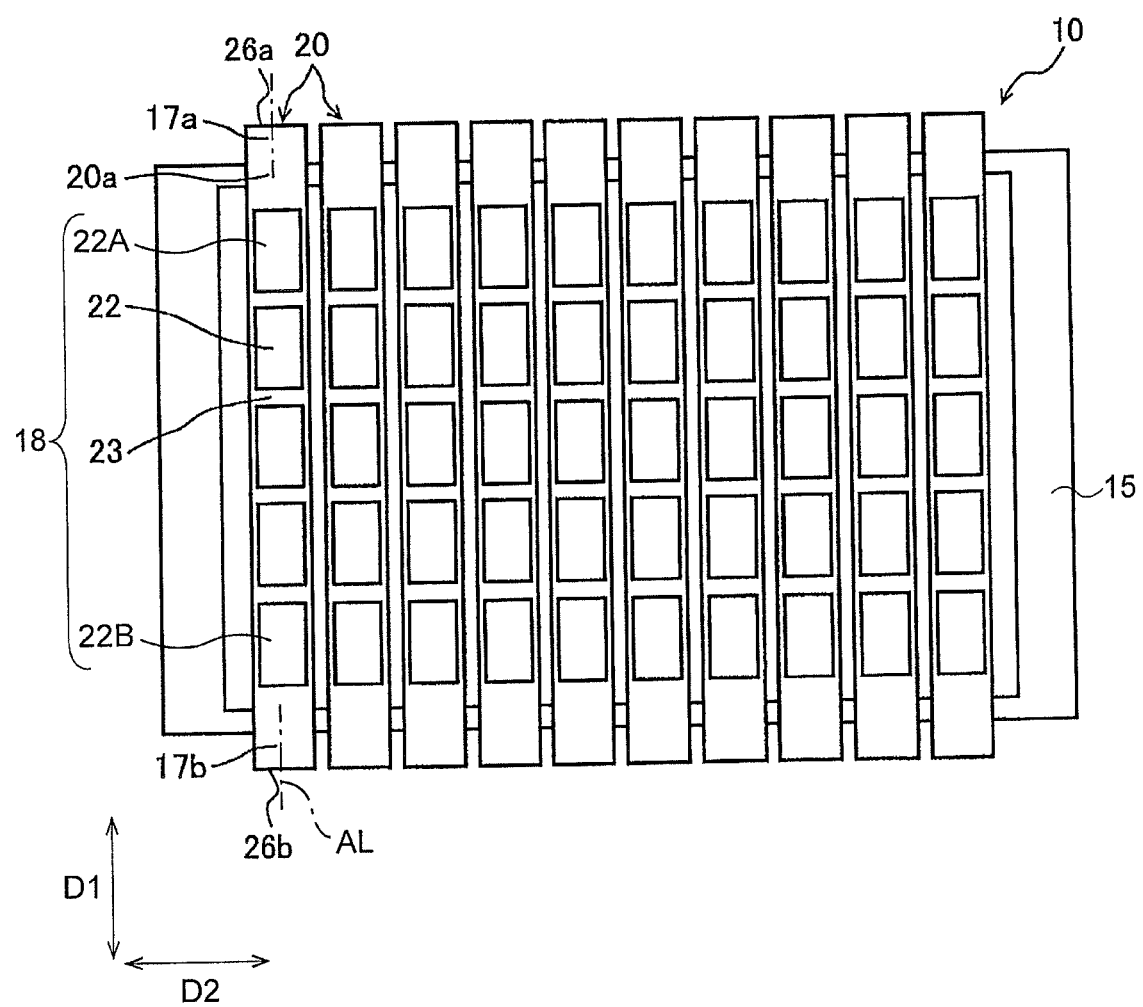
FIG. 3 is a plan view illustrating the deposition mask device according to the embodiment of the present invention.

FIG. 3 is a plan view illustrating a case where the deposition mask device 10 is viewed from the first surface 20a side of the deposition mask 20. As illustrated in FIG. 3, the deposition mask device 10 includes a plurality of the deposition masks 20 each having a substantially rectangular shape in a plan view, and each of the deposition masks 20 is fixed on the frame 15 at a pair of end portions 26a and 26b in a longitudinal direction D1 of the deposition mask 20.

The deposition mask 20 includes a metal plate having a plurality of through-holes 25 penetrating through the deposition mask 20. The deposition material 98 that has vaporized from the crucible 94 and reaches the deposition mask device 10 passes through the through-hole 25 of the deposition mask 20 and adheres to the organic EL substrate 92. As a result, the deposition material 98 can be deposited on the surface of the organic EL substrate 92 in a desired pattern corresponding to positions of the through-holes 25 of the deposition mask 20.

Figure 2:
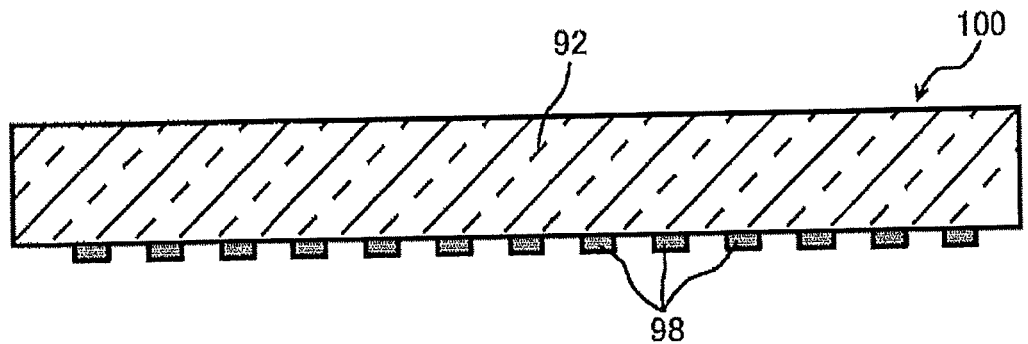
FIG. 2 is a cross-sectional view illustrating an organic EL display device manufactured using the deposition mask device illustrated in FIG. 1.

FIG. 2 is a cross-sectional view illustrating an organic EL display device 100 manufactured using the deposition device 90 of FIG. 1. The organic EL display device 100 includes the organic EL substrate 92 and a pixel containing the deposition material 98 provided in a pattern.

Incidentally, when it is desired to perform color display using a plurality of colors, the deposition devices 90 each of which has the deposition mask 20 corresponding to each color are prepared, and the organic EL substrate 92 is sequentially introduced into the respective deposition devices 90. As a result, for example, an organic light-emitting material for red, an organic light-emitting material for green, and an organic light-emitting material for blue can be sequentially deposited on the organic EL substrate 92.

Meanwhile, there is a case where the deposition process is performed inside the deposition device 90 which becomes high-temperature atmosphere. In this case, the deposition mask 20, the frame 15, and the organic EL substrate 92 held inside the deposition device 90 are also heated during the deposition process. At this time, each of the deposition mask 20, the frame 15, and the organic EL substrate 92 shows behavior of a dimensional change based on each thermal expansion coefficient. In this case, if thermal expansion coefficients of the deposition mask 20, the frame 15, and the organic EL substrate 92 are greatly different from each other, misalignment due to a difference in dimensional changes among them is generated, and as a result, dimensional accuracy and positional accuracy of the deposition material adhering onto the organic EL substrate 92 are lowered.

In order to solve such a problem, it is preferable that thermal expansion coefficients of the deposition mask 20 and the frame 15 be the same value as thermal expansion coefficient of the organic EL substrate 92. For example, when a glass substrate is used as the organic EL substrate 92, an iron alloy containing nickel can be used as a main material of the deposition mask 20 and the frame 15. For example, it is possible to use an iron alloy containing 30% by mass to 54% by mass of nickel as a material of the metal plate forming the deposition mask 20. Specific examples of the iron alloy containing nickel can include an invar material containing 34% by mass to 38% by mass of nickel, a super invar material containing cobalt in addition to 30% by mass to 34% by mass of nickel, and a low thermal expansion Fe—Ni plated alloy containing 38% by mass to 54% by mass of nickel.

Incidentally, when temperature of the deposition mask 20, the frame 15, and the organic EL substrate 92 does not reach high temperature during the deposition process, it is not particularly necessary to set thermal expansion coefficients of the deposition mask 20 and the frame 15 to the same value as thermal expansion coefficient of the organic EL substrate 92. In this case, a material other than the above-described iron alloy may be used as the material forming the deposition mask 20. For example, an iron alloy other than the above-described nickel-containing iron alloy such as an iron alloy containing chromium may be used. For example, an iron alloy referred to as a so-called stainless steel can be used as the iron alloy containing chromium. In addition, an alloy other than the iron alloy such as nickel and a nickel-cobalt alloy may be used.

(Deposition Mask)

Next, the deposition mask 20 will be described in detail. As illustrated in FIG. 3, the deposition mask 20 has a pair of ear portions (a first ear portion 17a and a second ear portion 17b) forming the pair of end portions (the first end portion 26a and the second end portion 26b) in the longitudinal direction D1 of the deposition mask 20 and an intermediate portion 18 positioned between the pair of ear portions 17a and 17b.

(Ear Portion)

First, the ear portions 17a and 17b will be described in detail. The ear portions 17a and 17b are portions to be fixed on the frame 15 of the deposition mask 20. In the present embodiment, the ear portions 17a and 17b are configured integrally with the intermediate portion 18. Incidentally, the ear portions 17a and 17b may be configured using members different from the intermediate portion 18. In this case, the ear portions 17a and 17b are bonded to the intermediate portion 18, for example by welding.

(Intermediate Portion)

Next, the intermediate portion 18 will be described. The intermediate portion 18 includes the effective region 22 in which the through-hole 25 extending from the first surface 20a to the second surface 20b is formed, and a surrounding region 23 positioned around the effective region 22 and surrounding the effective region 22. The effective region 22 is a region facing a display region of the organic EL substrate 92 in the deposition mask 20.

As illustrated in FIG. 3, the intermediate portion 18 includes the plurality of effective regions 22 arranged at predetermined intervals along the longitudinal direction D1 of the deposition mask 20. The single effective region 22 corresponds to one display region of the organic EL display device 100. Thus, it is possible to deposit the organic EL display device 100 with multiple surfaces according to the deposition mask device 10 illustrated in FIG. 1.

As illustrated in FIG. 3, the effective regions 22 has a substantially quadrangular shape in a plan view, more accurately, a substantially rectangular outline in a plan view, for example. Although not illustrated, each of the effective regions 22 can have outlines of various shapes in accordance with a shape of the display region of the organic EL substrate 92. For example, each of the effective regions 22 may have a circular outline.

Figure 4:
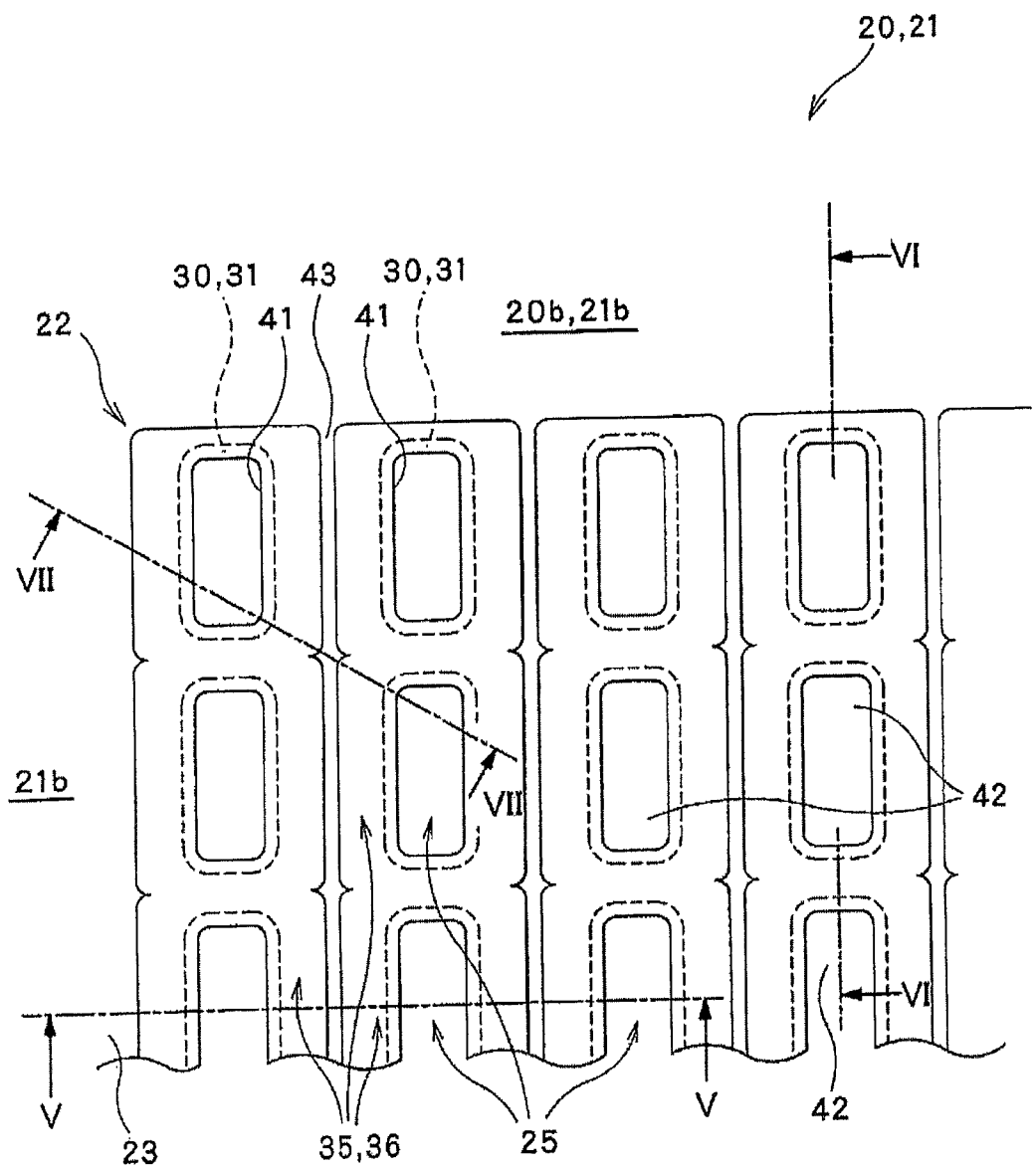
FIG. 4 is a partial plan view illustrating an effective region of the deposition mask illustrated in FIG. 3.
Figure 5:
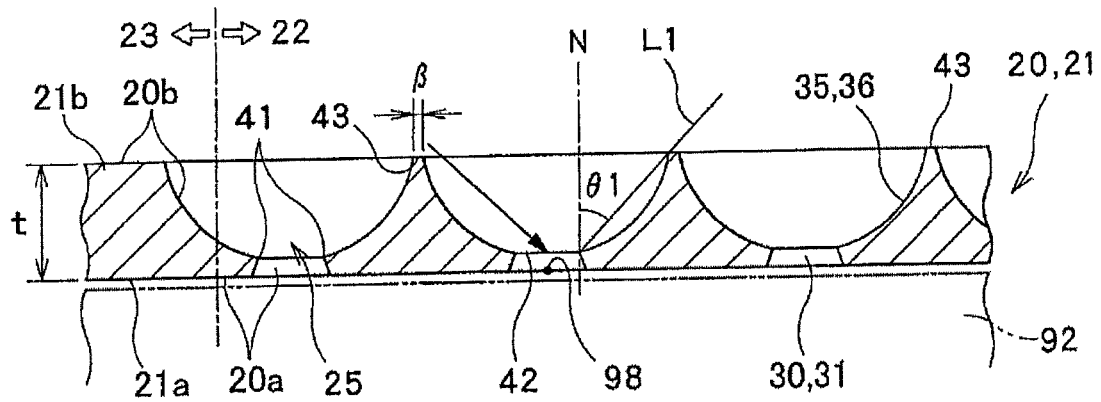
FIG. 5 is a cross-sectional view taken along the line V-V in FIG. 4.
Figure 6:
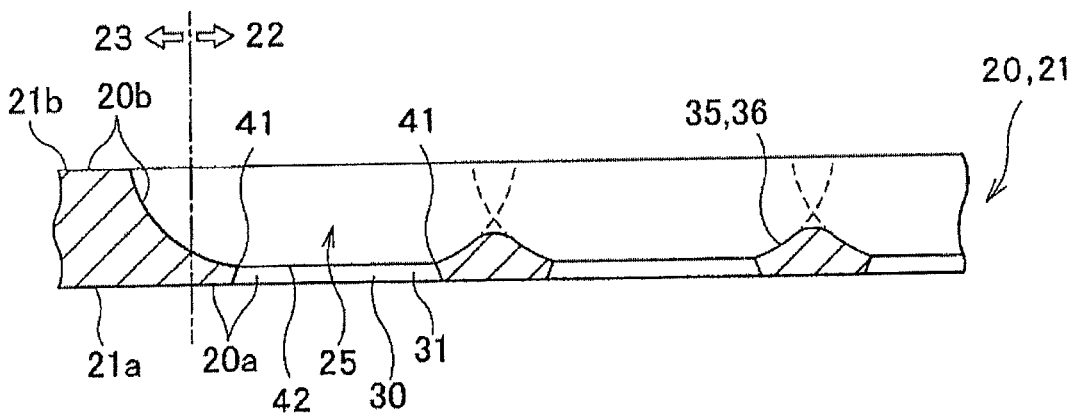
FIG. 6 is a cross-sectional view taken along the line VI-VI of FIG. 4.
Figure 7:
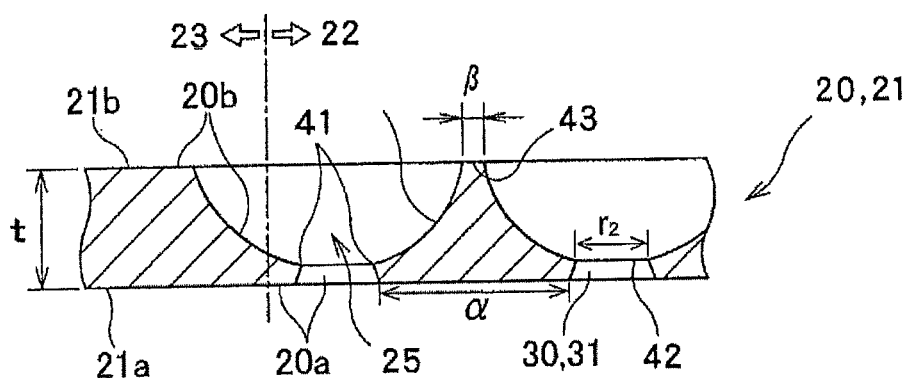
FIG. 7 is a cross-sectional view taken along the line VII-VII of FIG. 4.

Hereinafter, the effective region 22 will be described in detail. FIG. 4 is an enlarged plan view illustrating the effective region 22 from the second surface 20b side of the deposition mask 20. As illustrated in FIG. 4, the plurality of through-holes 25 formed in each of the effective regions 22 are arrayed at predetermined pitches along the two directions orthogonal to each other in the effective region 22 in the illustrated example. An example of the through-hole 25 will be described in more detail mainly with reference to FIGS. 5 to 7. FIGS. 5 to 7 are cross-sectional views taken along a direction V-V to a direction VII-VII of the effective region 22 of FIG. 4, respectively.

As illustrated in FIGS. 5 to 7, the plurality of through-holes 25 penetrates from the first surface 20a, which is one side along the normal direction N of the deposition mask 20, through the second surface 20b which is the other side along the normal direction N of the deposition mask 20. In the illustrated example, a first concave portion 30 is formed by etching on the first surface 21a of the metal plate 21, which is one side in the normal direction N of the deposition mask 20, and a second concave portion 35 is formed on the second surface 21b of the metal plate 21 which is the other side in the normal direction N of the deposition mask 20 as will be described in detail later. The first concave portion 30 is connected to the second concave portion 35 so that the second concave portion 35 and the first concave portion 30 communicate with each other. The through-hole 25 is formed of the second concave portion 35 and the first concave portion 30 connected to the second concave portion 35.

As illustrated in FIGS. 5 to 7, the opening area of each of the second concave portions 35 in a cross section along a plate plane of the deposition mask 20 at each position along the normal direction N of the deposition mask 20 gradually decreases from the second surface 20b side to the first surface 20a side of the deposition mask 20. Similarly, the opening area of each of the first concave portions 30 in the cross section along the plate plane of the deposition mask 20 at each position along the normal direction N of the deposition mask 20 gradually decreases from the first surface 20a side to the second surface 20b of the deposition mask 20.

As illustrated in FIGS. 5 to 7, a wall surface 31 of the first concave portion 30 and a wall surface 36 of the second concave portion 35 are connected via a circumferential connecting portion 41. The connecting portion 41 is defined by a ridge of an overhang where the wall surface 31 of the first concave portion 30 inclined with respect to the normal direction N of the deposition mask 20 and the wall surface 36 of the second concave portion 35 inclined with respect to the normal direction N of the deposition mask 20 are joined. Further, the connecting portion 41 defines a penetrating portion 42 where the opening area of the through-hole 25 is the minimum in a plan view of the deposition mask 20.

As illustrated in FIGS. 5 to 7, the two adjacent through-holes 25 are spaced apart from each other along the plate plane of the deposition mask 20 on a surface on the other side along the normal direction N of the deposition mask 20, that is, on the first surface 20a of the deposition mask 20. That is, when the first concave portion 30 is produced by etching the metal plate 21 from the first surface 21a side of the metal plate 21 corresponding to the first surface 20a of the deposition mask 20 as in a manufacturing method to be described later, the first surface 21a of the metal plate 21 remains between the two adjacent first concave portion 30.

Similarly, the two adjacent second concave portions 35 may be also spaced apart from each other along the plate plane of the deposition mask 20 on one side along the normal direction N of the deposition mask 20, that is, on the second surface 20b side of the deposition mask 20 as illustrated in FIGS. 5 and 7. That is, the second surface 21b of the metal plate 21 may remain between the two adjacent second concave portions 35. In the following description, a portion of the effective region 22 on the second surface 21b of the metal plate 21 that remains without being etched is also referred to as a top portion 43. As the deposition mask 20 is produced so as to leave such a top portion 43, it is possible to make the deposition mask 20 have sufficient strength. As a result, it is possible to suppress the deposition mask 20 from being damaged during handling, for example. Incidentally, if a width β of the top portion 43 is too large, shadow is generated in the deposition step so that the utilization efficiency of the deposition material 98 may decrease. Therefore, it is preferable that the deposition mask 20 be produced such that the width β of the top portion 43 does not become excessively large. For example, the width β of the top portion 43 is preferably 2 μm or less. Incidentally, the width β of the top portion 43 generally varies depending on a direction in which the deposition mask 20 is cut. For example, the widths β of the top portion 43 illustrated in FIGS. 5 and 7 may be different from each other. In this case, the deposition mask 20 may be configured such that the width β of the top portion 43 becomes 2 μm or less even when the deposition mask 20 is cut in any direction.

Incidentally, etching may be performed such that two adjacent second concave portions 35 are connected depending on places as illustrated in FIG. 6. That is, a place where the second surface 21b of the metal plate 21 does not remain may exist between the two adjacent second concave portions 35. In addition, etching may be performed such that the two adjacent second concave portions 35 are connected across the entire second surface 21b although not illustrated.

When the deposition mask device 10 is accommodated in the deposition device 90 as illustrated in FIG. 1, the first surface 20a of the deposition mask 20 faces the organic EL substrate 92 as illustrated by a two-dot chain line in FIG. 5, and the second surface 20b of the deposition mask 20 is positioned on a side of the crucible 94 holding the deposition material 98. Therefore, the deposition material 98 passes through the second concave portion 35 whose opening area gradually decreases and adheres to the organic EL substrate 92. The deposition material 98 not only moves along the normal direction N of the organic EL substrate 92 from the crucible 94 toward the organic EL substrate 92 but also moves in a direction which is greatly inclined with respect to the normal direction N of the organic EL substrate 92 as illustrated by an arrow directed from the second surface 20b side to the first surface 20a in FIG. 5. At this time, when the thickness of the deposition mask 20 is large, most of the deposition material 98 that obliquely moves reaches and adheres to the wall surface 36 of the second concave portion 35 before reaching the organic EL substrate 92 through the through-hole 25. Therefore, it is considered that it is preferable to reduce the thickness t of the deposition mask 20 so as to reduce the height of the wall surface 36 of the second concave portion 35 or the wall surface 31 of the first concave portion 30 in order to enhance the utilization efficiency of the deposition material 98. That is, it can be said that it is preferable to use the metal plate 21 having the thickness t, as small as possible, within a range where the strength of the deposition mask 20 can be secured, as the metal plate 21 to form the deposition mask 20. In consideration of this point, the thickness t of the deposition mask 20 is preferably set to 85 μm or less, for example, 5 μm to 85 μm in the present embodiment. Incidentally, the thickness t is a thickness of the surrounding region 23, that is, a thickness of the portion of the deposition mask 20 where the first concave portion 30 and the second concave portion 35 are not formed. Therefore, it can be said that the thickness t is the thickness of the metal plate 21.

In FIG. 5, a minimum angle of a straight line L1, which passes through the connecting portion 41, which is the portion having the minimum opening area of the through-hole 25, and another arbitrary position of the wall surface 36 of the second concave portion 35, with respect to the normal direction N of the deposition mask 20 is indicated by a reference sign θ1. It is advantageous to increase the angle θ1 in order to allow the deposition material 98 moving obliquely to reach the organic EL substrate 92 as much as possible without reaching the wall surface 36. Upon increasing the angle θ1, it is also advantageous to not only reduce the thickness t of the deposition mask 20 but also reduce the above-described width β of the top portion 43.

In FIG. 7, a reference sign a represents a width of a portion (hereinafter also referred to as a rib portion) remaining without being etched in the effective region 22 of the first surface 21a of the metal plate 21. The width α of the rib portion and a dimension $r_2$ of the penetrating portion 42 are appropriately determined according to dimensions of the organic EL display device and the number of display pixels. Table 1 shows exemplary values of the width α of the rib portion and the dimension $r_2$ of the penetrating portion 42 obtained depending on the number of display pixels, in a 5-inch organic EL display device.

TABLE 1

| Number of display pixels | Width of rib portion | Dimension of penetrating portion |
|---|---|---|
| FHD (Full High Definition) | 20 μm | 40 μm |
| WQHD (Wide Quad High Definition) | 15 μm | 30 μm |
| UHD (Ultra High Definition) | 10 μm | 20 μm |

Figure 8:
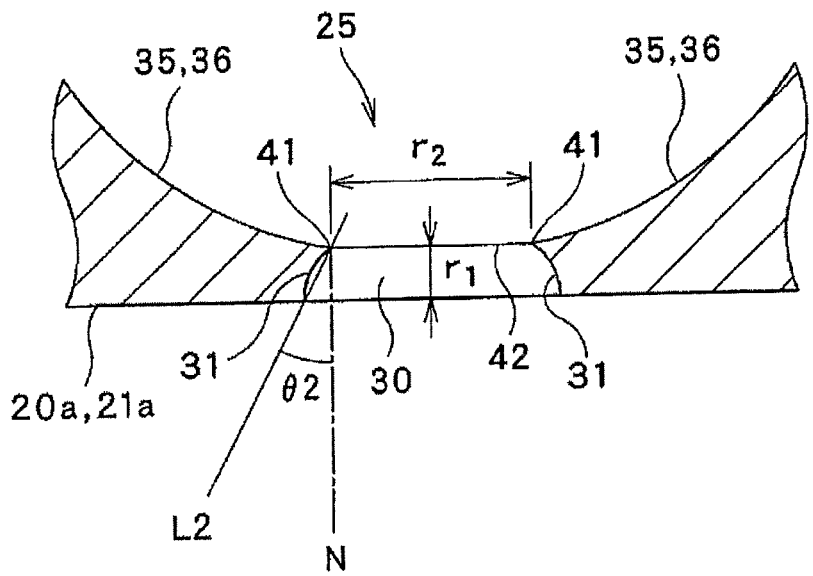
FIG. 8 is an enlarged cross-sectional view illustrating a through-hole illustrated in FIG. 5 and a region in the vicinity thereof.

Although not limited, the deposition mask 20 according to the present embodiment is particularly advantageous in the case of manufacturing an organic EL display device having a pixel density of 450 ppi or more. Hereinafter, exemplary dimensions of the deposition mask 20 required to manufacture such an organic EL display device having a high pixel density will be described with reference to FIG. 8. FIG. 8 is an enlarged cross-sectional view illustrating the through-hole 25 of the deposition mask 20 illustrated in FIG. 5 and the vicinity thereof.

In FIG. 8, a distance from the first surface 20a of the deposition mask 20 to the connecting portion 41 in the direction along the normal direction N of the deposition mask 20, that is, a height of the wall surface 31 of the first concave portion 30 is represented by a reference sign $r_1$ as a parameter relating to a shape of the through-hole 25. Further, a dimension of the first concave portion 30 at a portion where the first concave portion 30 is connected to the second concave portion 35, that is, a dimension of the penetrating portion 42 is represented by a reference sign $r_2$. In addition, an angle of a straight line L2, which connects the connecting portion 41 and a distal edge of the first concave portion 30 on the first surface 21a of the metal plate 21, with respect to the normal direction N of the metal plate 21 is represented by a reference sign θ2 in FIG. 8.

In the case of manufacturing an organic EL display device having a pixel density of 450 ppi or more, the dimension $r_2$ of the penetrating portion 42 is preferably set to 10 to 60 μm. As a result, it is possible to provide the deposition mask 20 capable of manufacturing the organic EL display device having a high pixel density. Preferably, the height $r_1$ of the wall surface 31 of the first concave portion 30 is set to 6 μm or less.

Next, the above-described angle θ2 illustrated in FIG. 8 will be described. The angle θ2 corresponds to a maximum value of an inclination angle of the deposition material 98 that can reach the organic EL substrate 92 among the deposition materials 98 inclined with respect to the normal direction N of the metal plate 21 and flown to pass through the penetrating portion 42 in the vicinity of the connecting portion 41. This is because the deposition materials 98 that have passed through the connecting portion 41 and flown with an inclination angle larger than the angle θ2 adhere to the wall surface 31 of the first concave portion 30 before reaching the organic EL substrate 92. Therefore, it is possible to prevent the deposition material 98 that have flown with a large inclination angle and passed through the penetrating portion 42 from adhering to the organic EL substrate 92 by decreasing the angle θ2, and accordingly, it is possible to prevent the deposition material 98 from adhering to a portion outside a portion of the organic EL substrate 92 overlapping with the penetrating portion 42. That is, the decrease of the angle θ2 leads to suppression of variations in the area and thickness of the deposition material 98 adhering to the organic EL substrate 92. From this viewpoint, for example, the through-hole 25 is formed such that the angle θ2 is 45 degrees or smaller. Incidentally, FIG. 8 illustrates an example in which a dimension of the first concave portion 30 in the first surface 21a, that is, an opening dimension of the through-hole 25 in the first surface 21a is larger than a dimension r2 of the first concave portion 30 in the connecting portion 41. That is, an example in which a value of the angle θ2 is a positive value is illustrated. However, the dimension r2 of the first concave portion 30 in the connecting portion 41 may be larger than the dimension of the first concave portion 30 in the first surface 21a although not illustrated. That is, the value of the angle θ2 may be a negative value.

Incidentally, as illustrated in FIG. 3, the deposition mask 20 is formed to extend in the longitudinal direction D1 (first direction) from the first ear portion 17a forming the first end portion 26a to the second ear portion 17b forming the second end portion 26b as described above. Here, the longitudinal direction D1 is a direction parallel to a conveying direction at the time of rolling the base material 55 (see FIG. 10), which is the longitudinal direction of the deposition mask 20 in which the plurality of effective regions 22 is arranged. Incidentally, the term "conveying" is used to indicate conveyance of the base material 55 by roll-to-roll as will be described later. In addition, a width direction D2 (second direction) to be described later is a direction orthogonal to the longitudinal direction D1 in a plane direction of the metal plate 21 or the elongated metal plate 64. Further, the deposition mask 20 has a central axis line AL extending in the longitudinal direction D1 and arranged at a central position in the width direction D2. When the number of the through-holes 25 in the width direction D2 is an odd number, the central axis line AL passes through a center point of the through-hole 25 at the center in the width direction D2. On the other hand, when the number of the through-holes 25 in the width direction D2 is an even number, the central axis line AL passes through an intermediate point between two through-holes 25 adjacent to each other in the vicinity of the center in the width direction D2.

Figure 9:
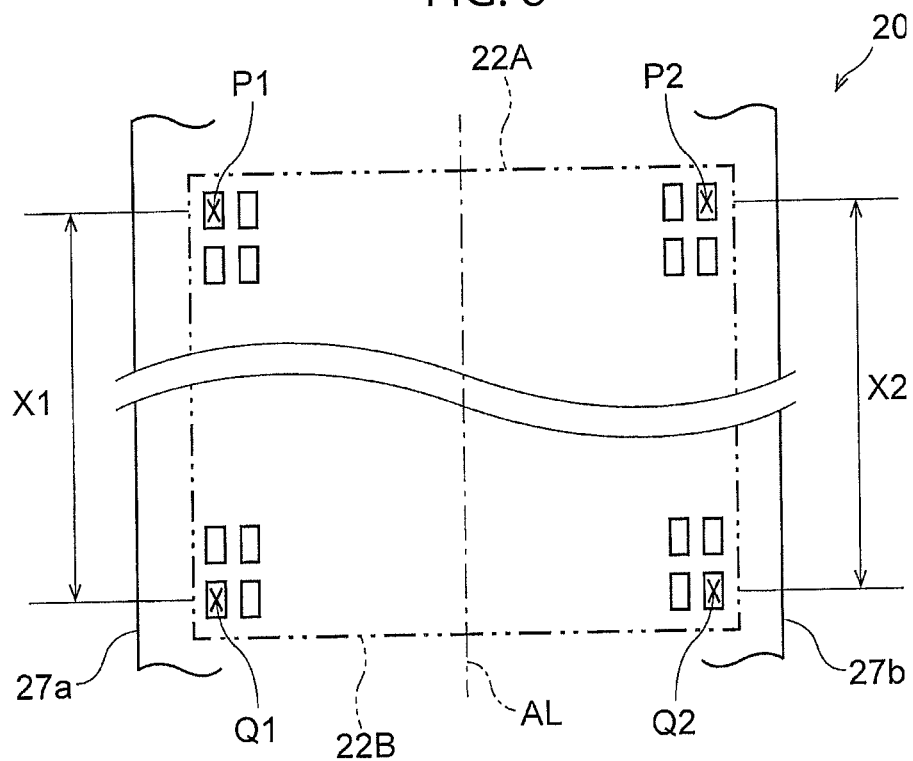
FIG. 9 is a schematic view for describing dimensions X1 and X2 in the deposition mask of FIG. 3.

As illustrated in FIG. 9, when a dimension from a point P1 to a point Q1 to be described later is X1, a dimension from a point P2 to a point Q2 is X2, and a predetermined value is $\alpha_X$, the deposition mask 20 according to the present embodiment satisfies the following.

[Formula 5]

$$\left|\alpha_X - \frac{X1 + X2}{2}\right| \leq 40 \text{ μm} \quad (1)$$

[Formula 6]

$$|X1 - X2| \leq 60 \text{ μm} \quad (2)$$

Here, the left side of Formula (1) indicates an absolute value of an average value of a difference between the predetermined value and the dimension X1 and a difference between the predetermined value and the dimension X2. The left side of Formula (2) indicates an absolute value of a difference between the dimension X1 and the dimension X2.

Here, the point P1 and the point Q1 are provided on one side (left side in FIG. 9) of the central axis line AL of the deposition mask 20, and are spaced apart from each other along the longitudinal direction D1. The points P2 and Q2 are provided on the other side (right side in FIG. 9) of the central axis line AL of the deposition mask 20, and are spaced apart from each other along the longitudinal direction D1. The points P1 and P2 are arranged to be symmetric with each other with respect to the central axis line AL at the time of deposition. More specifically, the points P1 and P2 are points which are intentionally arranged to be symmetric with each other with respect to the central axis line AL at the time of deposition, and points that are arranged to be symmetric with each other with respect to the central axis line AL at the time of designing. Similarly, the points Q1 and Q2 are arranged to be symmetric with each other with respect to the central axis line AL at the time of deposition.

In the present embodiment, the points P1, Q1, P2, and Q2 are positioned at center points of the corresponding through-holes 25 provided between the first ear portion 17a and the second ear portion 17b. That is, the plurality of effective regions 22 includes a first effective region 22A arranged on a side closest to the first ear portion 17a and a second effective region 22B arranged on a side closest to the second ear portion 17b in the present embodiment. The point P1 and the point P2 are positioned at the center points of the through-holes 25 formed in the first effective region 22A. Further, the through-holes 25 corresponding to the points P1 and P2 are formed to be closest to the first ear portion 17a among the plurality of through-holes 25 in the first effective region 22A. On the other hand, the point Q1 and the point Q2 are positioned at the center points of the through-holes 25 formed in the second effective region 22B. Further, the through-holes 25 corresponding to the points Q1 and Q2 are formed to be closest to the second ear portion 17b among the through-holes 25 in the second effective region 22B. The dimension X1 means a linear distance between the point P1 and the point Q1 of the deposition mask 20 placed stationarily on the stage 81 or the like, which will be described later, and the dimension X2 means s linear distance between the point P2 and the point Q2 of the deposition mask 20. The deposition mask 20 placed stationarily on the stage 81 or the like bends in a C-shape as will be described later (see FIG. 24), and details thereof will be described later. Incidentally, the through-holes 25 corresponding to the points P1 and Q1 are positioned to be closest to a first side edge 27a, and the through-holes 25 corresponding to the points P2 and Q2 are positioned to be closest to a second side edge 27b.

The predetermined value $\alpha_X$ illustrated in Formula (1) may be a design value (or a specification value). In this case, $\alpha_X$ is a design value of the dimension X1 and also a design value of the dimension X2. It is because the dimensions X1 and X2 are the same at the time of designing since the points P1, Q1, P2, and Q2 are symmetrically positioned with respect to the central axis line AL of the deposition mask 20. Here, the design value is a numerical value which is set with an intention to arrange the through-hole 25 at a desired position (deposition target position) when stretched to be installed on the frame 15.

Next, a method of manufacturing the deposition mask 20 will be described.

Method of Manufacturing Metal Plate

First, a method of manufacturing a metal plate used to manufacture the deposition mask will be described.

(Rolling Step)

Figure 10:
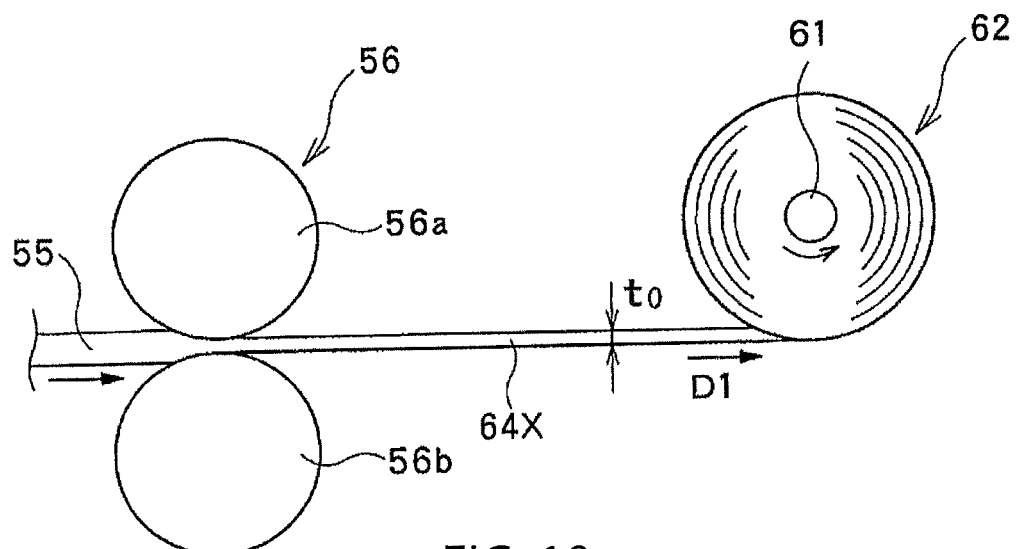
FIG. 10 is a view illustrating a step of rolling a base material to obtain a metal plate having a desired thickness.

First, the base material 55 made of an iron alloy containing nickel is prepared, and this base material 55 is conveyed toward a rolling device 56 including a pair of rolling rolls 56a and 56b along a direction indicated by an arrow D1 as illustrated in FIG. 10. The base material 55 that has reached between the pair of the rolling rolls 56a and 56b is rolled by the pair of rolling rolls 56a and 56b, and as a result, the base material 55 is reduced in thickness and stretched along the conveying direction. As a result, a plate material 64X having a thickness $t_0$ can be obtained. As illustrated in FIG. 10, a winding body 62 may be formed by winding the plate material 64X around a core 61. A specific value of the thickness $t_0$ is preferably 5 μm to 85 μm as described above.

Incidentally, FIG. 10 illustrates only an outline of the rolling step, and specific configuration and procedure for carrying out the rolling step are not particularly limited. For example, the rolling step may include a hot rolling step of processing a base material at a temperature equal to or higher than a temperature at which a crystal array of an invar material forming the base material 55 is changed and a cold rolling step of processing a base material at a temperature equal to or lower than the temperature at which the crystal array of the invar material is changed. In addition, a direction in which the base material 55 or the plate material 64X passes between the pair of rolling rolls 56a and 56b is not limited to one direction. For example, the base material 55 or the plate material 64X may be gradually rolled by repeatedly causing the base material 55 or the plate material 64X to pass between the pair of rolling rolls 56a and 56b in a direction from the left side to the right side of the paper plane and from the right side to the left side of the paper plane in FIGS. 10 and 11.

(Slitting Step)

Thereafter, a slitting step may be executed to cut off both ends of the plate material 64X obtained in the rolling step in the width direction over a predetermined range such that a width of the plate material 64X falls within a predetermined range. This slitting step is executed in order to remove a crack that may occur at both the ends of the plate material 64X due to rolling. As such a slitting step is executed, it is possible to prevent a phenomenon that the plate material 64X breaks, that is, generation of a so-called plate breakage due to the crack as a starting point.

(Annealing Step)

Figure 11:
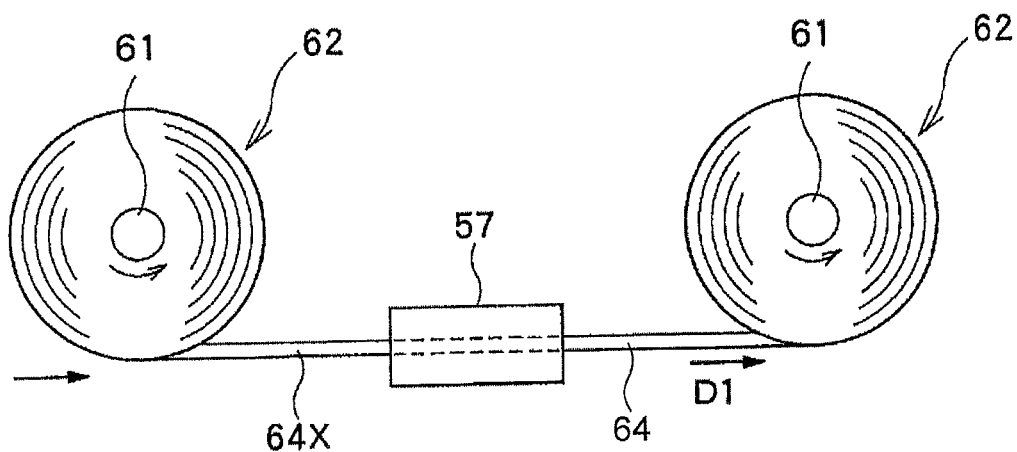
FIG. 11 is a view illustrating a step of annealing the metal plate obtained by rolling.

Thereafter, the plate material 64X is annealed using an annealing device 57 in order to remove residual stress (internal stress) accumulated in the plate material 64X by rolling, thereby obtaining the elongated metal plate 64 as illustrated in FIG. 11. As illustrated in FIG. 11, the annealing step may be executed while pulling the plate material 64X or the elongated metal plate 64 in the conveying direction (longitudinal direction). That is, the annealing step may be executed not as so-called batch-type annealing but as continuous annealing while performing conveyance.

Preferably, the annealing step is performed in a non-reducing atmosphere or an inert gas atmosphere. Here, the non-reducing atmosphere is an atmosphere not containing a reducing gas such as hydrogen. "Not containing a reducing gas" means that a concentration of the reducing gas such as hydrogen is 4% or less. The inert gas atmosphere is an atmosphere in which 90% or more of an inert gas such as an argon gas, a helium gas, and a nitrogen gas is present. As the annealing step is executed in the non-reducing atmosphere or the inert gas atmosphere, it is possible to suppress generation of nickel hydroxide on the first surface 64a or the second surface 64b of the elongated metal plate 64.

Since the annealing step is executed, it is possible to obtain the elongated metal plate 64 having the thickness $t_0$ from which residual strain has been removed to some extent. The thickness $t_0$ is usually equal to the thickness t of the deposition mask 20.

The elongated metal plate 64 having the thickness $t_0$ may be produced by repeating the above-described rolling step, slitting step, and annealing step a plurality of times. In addition, FIG. 11 illustrates the example in which the annealing step is performed while pulling the elongated metal plate 64 in the longitudinal direction, but the present invention is not limited thereto, and the annealing step may be executed in a state where the elongated metal plate 64 is wound around the core 61. That is, the batch-type annealing may be executed. In the case where the annealing step is executed in the state where the elongated metal plate 64 is wound around the core 61, there is a case where the elongated metal plate 64 is subject to warpage according to a winding diameter of the winding body 62. Therefore, it is advantageous to execute the annealing step while pulling the elongated metal plate 64 in the longitudinal direction depending on a winding diameter of the winding body or and a material forming the base material 55 of the winding body 62.

(Cutting Step)

Thereafter, each of both ends of the elongated metal plate 64 in the width direction is cut off over a predetermined range, thereby performing a cutting step of adjusting a width of the elongated metal plate 64 to a desired width. In this manner, the elongated metal plate 64 having a desired thickness and width can be obtained.

(Method of Manufacturing Deposition Mask)

Next, a method of manufacturing the deposition mask 20 using the elongated metal plate 64 will be described mainly with reference to FIGS. 12 to 20. In the method of manufacturing the deposition mask 20 to be described hereinafter, the elongated metal plate 64 is supplied, the through-hole 25 is formed in the elongated metal plate 64, and the elongated metal plate 64 is cut, thereby obtaining the deposition mask 20 made of the sheet-like metal plate 21 as illustrated in FIG. 12.

More specifically, the method of manufacturing the deposition mask 20 include: a step of supplying the elongated metal plate 64 extending in a band shape; a step of performing etching on the elongated metal plate 64 using a photolithography technique to form the first concave portion 30 from the first surface 64a side in the elongated metal plate 64, and a step of performing etching on the elongated metal plate 64 using a photolithography technique to form the second concave portion 35 in the elongated metal plate 64 from the second surface 64b side. Further, the first concave portion 30 and the second concave portion 35 formed in the elongated metal plate 64 communicate with each other, thereby producing the through-hole 25 in the elongated metal plate 64. In the examples illustrated in FIGS. 13 to 20, the step of forming the first concave portion 30 is performed before the step of forming the second concave portion 35, and a step of sealing the produced first concave portion 30 is further provided between the step of forming the first concave portion 30 and the step of forming the second concave portion 35. Details of each step will be described hereinafter.

Figure 12:
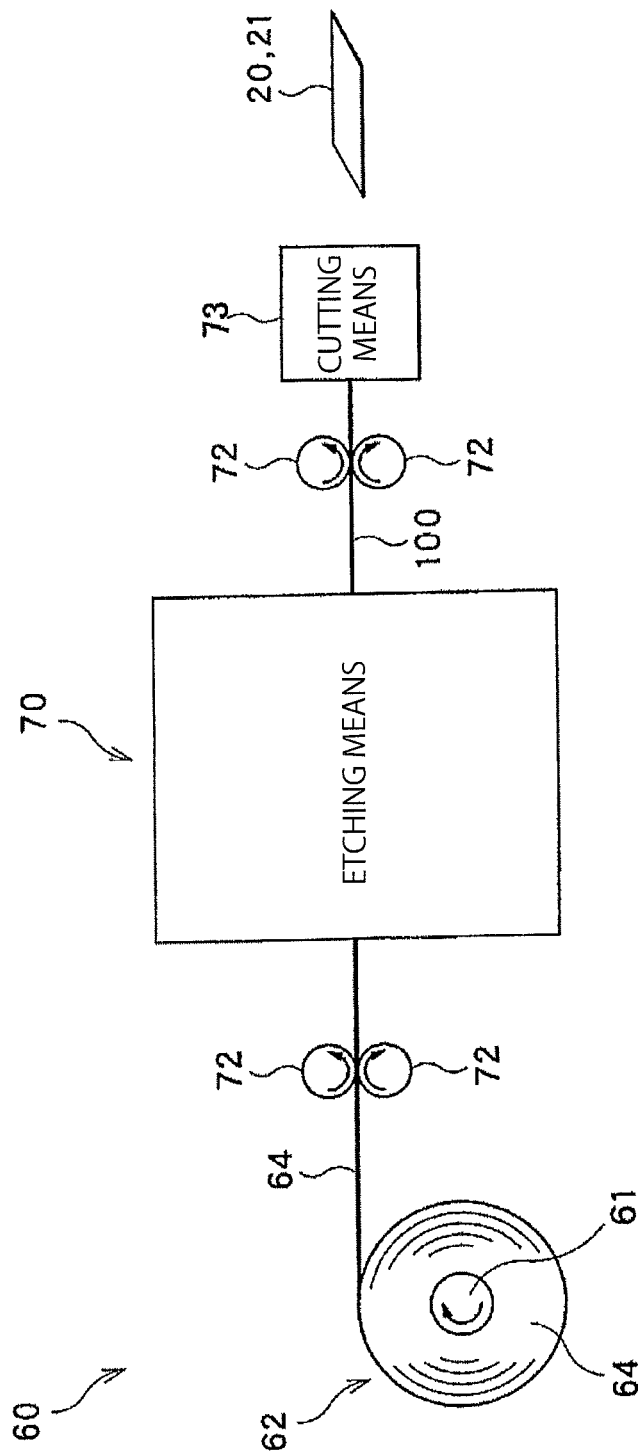
FIG. 12 is a schematic view for describing an example of a method of manufacturing a deposition mask as a whole.

In FIG. 12, a manufacturing device 60 configured to produce the deposition mask 20 is illustrated. First, a winding body (metal plate roll) 62 obtained by winding the elongated metal plate 64 around the core 61 is prepared as illustrated in FIG. 12. Then, as the core 61 rotates and the winding body 62 is unwound, the elongated metal plate 64 extending in the band shape is supplied as illustrated in FIG. 12. Incidentally, the elongated metal plate 64 is formed with the through-hole 25 to form the sheet-like metal plate 21, and further, the deposition mask 20.

The supplied elongated metal plate 64 is conveyed to an etching device (etching means) 70 by a conveying roller 72. Each process illustrated in FIGS. 13 to 20 is performed by the etching device 70. Incidentally, it is assumed that the plurality of deposition masks 20 is allocated in the width direction of the elongated metal plate 64 in the present embodiment. That is, the plurality of deposition masks 20 is produced from regions occupying predetermined positions of the elongated metal plate 64 in the longitudinal direction. In this case, the plurality of deposition masks 20 is allocated to the elongated metal plate 64 preferably such that the longitudinal direction of the deposition mask 20 coincides with a rolling direction of the elongated metal plate 64.

Figure 13:
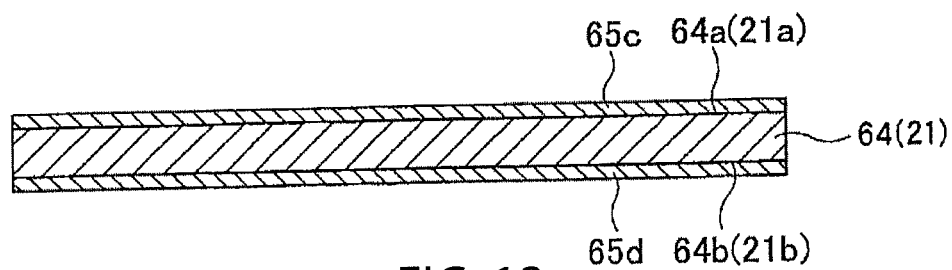
FIG. 13 is a view illustrating a step of forming a resist film on the metal plate.

First, resist films 65c and 65d containing a negative photosensitive resist material are formed on the first surface 64a and the second surface 64b of the elongated metal plate 64 as illustrated in FIG. 13. A method of pasting a film formed with a layer containing a photosensitive resist material such as an acrylic photocurable resin, that is, a so-called dry film on the first surface 64a and the second surface 64b of the elongated metal plate 64 is adopted as a method of forming the resist films 65c and 65d.

Figure 14:
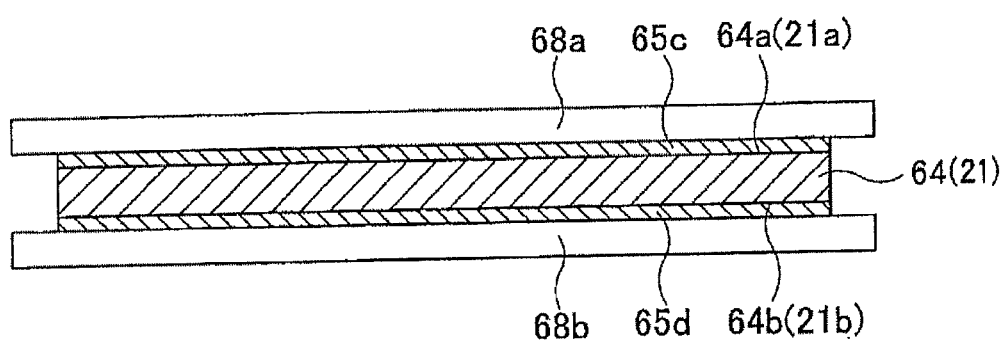
FIG. 14 is a view illustrating a step of bringing an exposure mask into close contact with the resist film.

Next, exposure masks 68a and 68b which allow light to pass through regions that are desirably removed in the resist films 65c and 65d are prepared, and the exposure masks 68a and 68b are arranged on the resist films 65c and 65d, respectively, as illustrated in FIG. 14. For example, a glass dry plate which does not allow light to pass through the regions that are desirably removed in the resist films 65c and 65d is used as the exposure masks 68a and 68b. Thereafter, the exposure masks 68a and 68b are sufficiently brought into close contact with the resist films 65c and 65d by vacuum adhesion. Incidentally, a positive material may be used as photosensitive resist material. In this case, an exposure mask configured to allow light to pass through a region that is desirably removed out of the resist film is used as the exposure mask.

Figure 15:
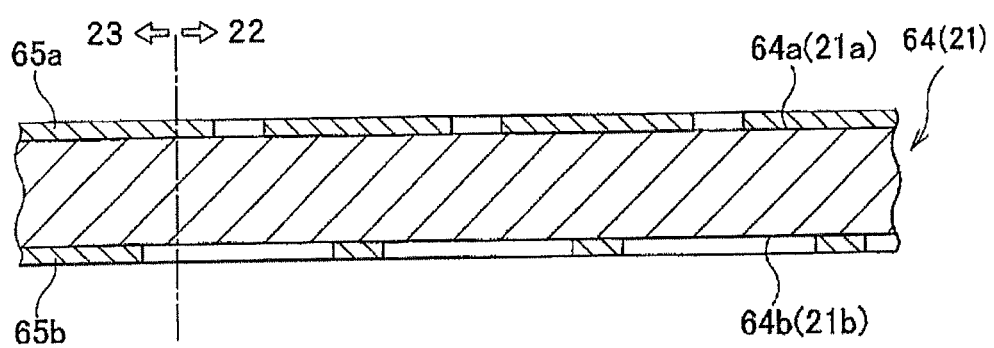
FIG. 15 is a view illustrating a step of developing the resist film.

Thereafter, the resist films 65c and 65d are exposed to light through the exposure masks 68a and 68b (an exposure step). Further, the resist films 65c and 65d are developed to form images on the exposed resist films 65c and 65d (a developing step). As described above, it is possible to form the first resist pattern 65a on the first surface 64a of the elongated metal plate 64 and the second resist pattern 65b on the second surface 64b of the elongated metal plate 64 as illustrated in FIG. 15. Incidentally, the developing step may include a resist heat treatment step for enhancing each hardness of the resist films 65c and 65d or more strongly bringing the resist films 65c and 65d to be close contact with the elongated metal plate 64. The resist heat treatment step is executed in an atmosphere of an inert gas such as an argon gas, a helium gas, and a nitrogen gas at, for example, 100° C. to 400° C.

Figure 16:
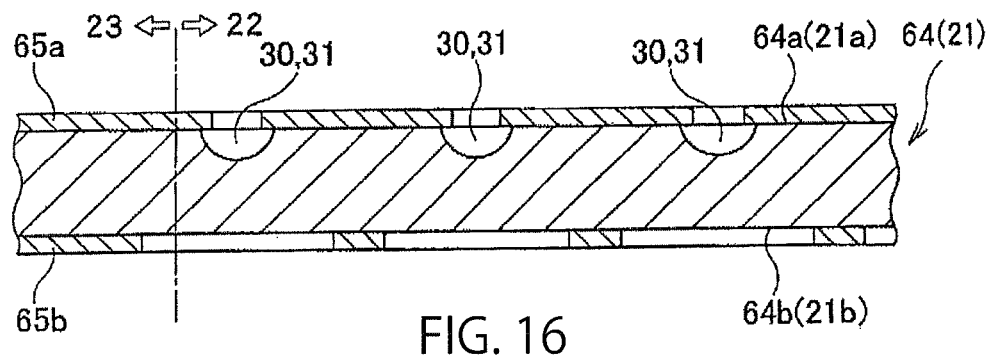
FIG. 16 is a view illustrating a first surface etching step.

Next, a first surface etching step of etching a region of the first surface 64a of the elongated metal plate 64 that is not covered with the first resist pattern 65a by using a first etching solution is performed as illustrated in FIG. 16. For example, the first etching solution is sprayed from a nozzle arranged on a side opposing the first surface 64a of the conveyed elongated metal plate 64 toward the first surface 64a of the elongated metal plate 64 through the first resist pattern 65a. As a result, erosion by the first etching solution proceeds in the region of the elongated metal plate 64 that is not covered with the first resist pattern 65a as illustrated in FIG. 16. As a result, a large number of the first concave portions 30 are formed in the first surface 64a of the elongated metal plate 64. For example, a solution containing a ferric chloride solution and hydrochloric acid is used as the first etching solution.

Figure 17:
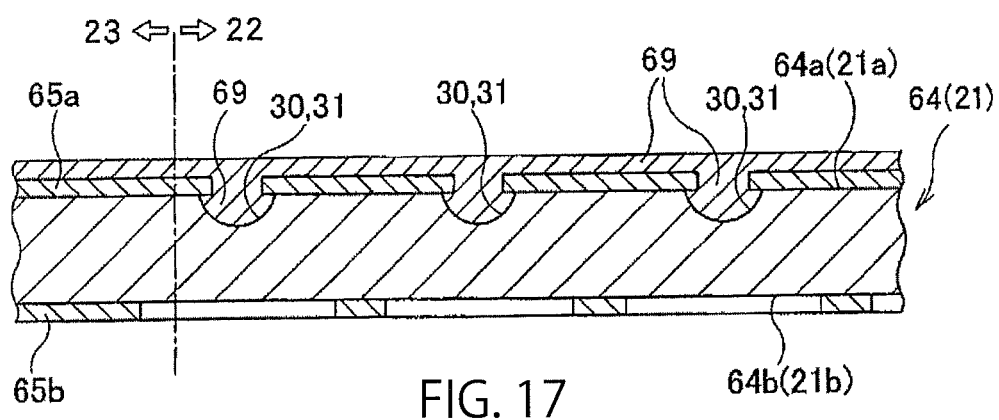
FIG. 17 is a view illustrating a step of coating a first concave portion with resin.

Thereafter, the first concave portion 30 is covered with a resin 69 having resistance against a second etching solution to be used in a subsequent second surface etching step as illustrated in FIG. 17. That is, the first concave portion 30 is sealed by the resin 69 having resistance against the second etching solution. In the example illustrated in FIG. 17, a film of the resin 69 is formed so as to cover not only the formed first concave portion 30 but also the first surface 64a (the first resist pattern 65a).

Figure 18:
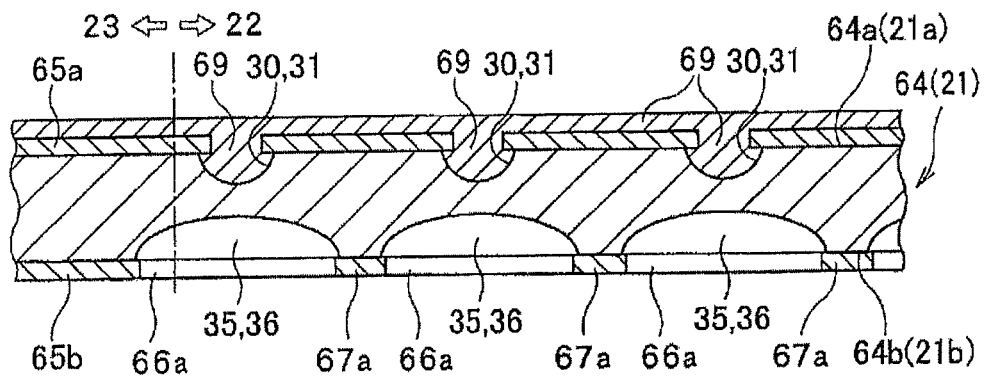
FIG. 18 is a view illustrating a second surface etching step.

Next, the second surface etching step of etching a region of the second surface 64b of the elongated metal plate 64 that is not covered with the second resist pattern 65b to form the second concave portion 35 on the second surface 64b is performed as illustrated in FIG. 18. The second surface etching step is performed until the first concave portion 30 and the second concave portion 35 communicate with each other to form the through-hole 25. For example, a solution containing a ferric chloride solution and hydrochloric acid is used as the second etching solution, which is similar to the above-described first etching solution.

Figure 19:
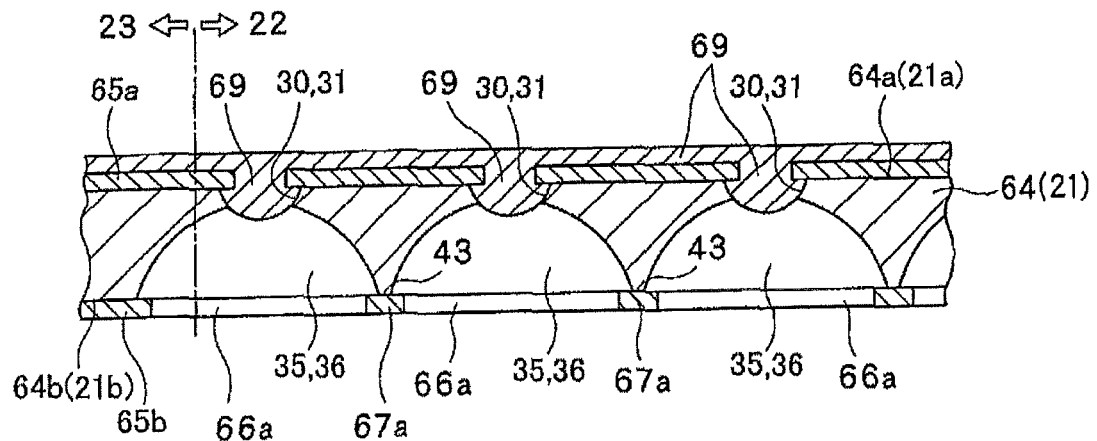
FIG. 19 is a view illustrating the second surface etching step subsequent to FIG. 18.

Incidentally, the erosion by the second etching solution is performed in a portion of the elongated metal plate 64 which is in contact with the second etching solution. Therefore, the erosion proceeds not only in the normal direction N (thickness direction) of the elongated metal plate 64 but also in the direction along the plate plane of the elongated metal plate 64. Here, the second surface etching step is preferably ended before the two second concave portions 35 respectively formed at positions opposing two adjacent holes 66a of the second resist pattern 65b join each other on the back side of a bridge portion 67a positioned between the two holes 66a. As a result, the above-described top portion 43 can be left on the second surface 64b of the elongated metal plate 64 as illustrated in FIG. 19.

Figure 20:
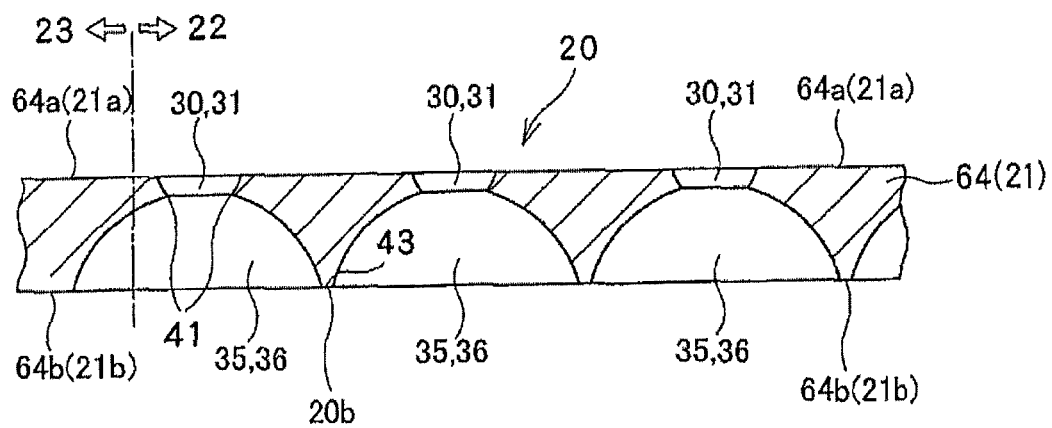
FIG. 20 is a view illustrating a step of removing resin and a resist pattern from a elongated metal plate.

Thereafter, the resin 69 is removed from the elongated metal plate 64 as illustrated in FIG. 20. The resin 69 can be removed, for example, by using an alkali-based peeling solution. When the alkali-based peeling solution is used, the resist patterns 65a and 65b can also be removed simultaneously with the resin 69 as illustrated in FIG. 20. Incidentally, the resist patterns 65a and 65b may be removed separately from the resin 69 by using a peeling solution different from the peeling solution for peeling the resin 69 after removing the resin 69.

The elongated metal plate 64 having a large number of the through-holes 25 formed in this manner is conveyed to a cutting device (cutting means) 73 by conveying rollers 72 and rotating while holding the elongated metal plate 64. Incidentally, the above-described supplied core 61 is rotated via a tension (tensile stress) acting on the elongated metal plate 64 due to the rotation of the conveying rollers 72 and 72, and the elongated metal plate 64 is supplied from the winding body 62.

Thereafter, the elongated metal plate 64 having a large number of the through-holes 25 formed therein is cut into predetermined length and width by the cutting device 73, thereby obtaining the sheet-like metal plate 21 having a large number of the through-holes 25 formed therein, that is, the deposition mask 20.

Method of Quality Determining of Deposition Mask

Next, a method of quality determining of the deposition mask 20 by measuring the dimension X1 and the dimension X2 of the deposition mask 20 will be described with reference to FIGS. 21 to 24. Here, the method of measuring the dimensions X1 and X2 and quality determining of the deposition mask 20 based on the measurement result will be described. That is, it is possible to detect whether the through-hole 25 of the deposition mask 20 is arranged as designed by measuring the dimension X1 and the dimension X2, and accordingly, it can be determined whether the positional accuracy of the through-hole 25 of the deposition mask 20 satisfies a predetermined criterion.

Figure 21:
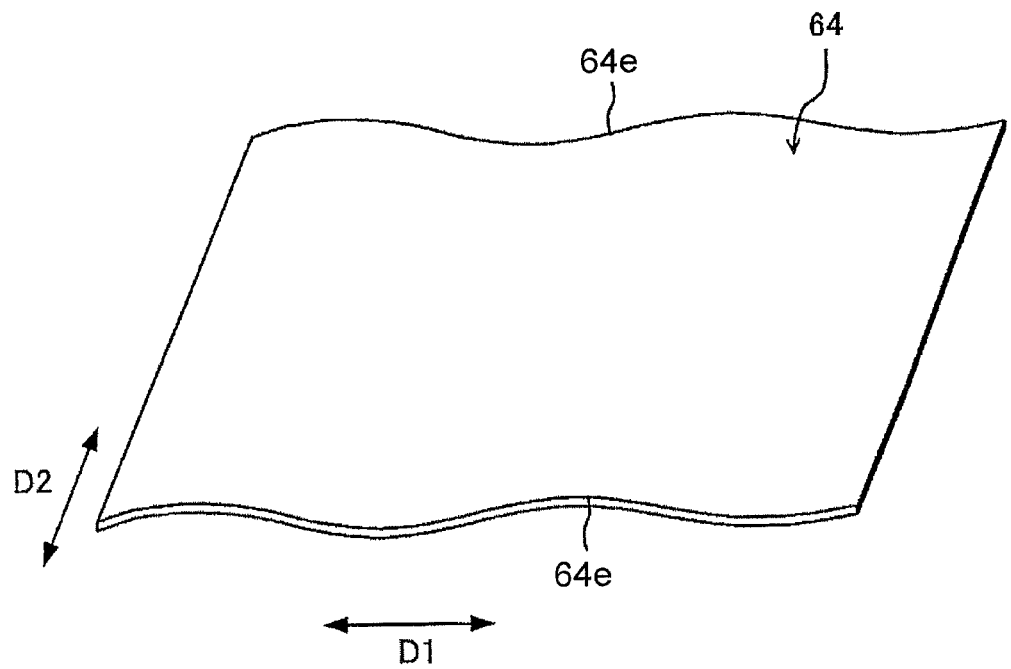
FIG. 21 is a perspective view illustrating an example of the elongated metal plate obtained by rolling.

Meanwhile, it is necessary to increase a rolling ratio at the time of rolling the base material to manufacture the metal plate 21 in order to obtain the metal plate 21 having a small thickness. However, as the rolling ratio increases, the degree of unevenness of deformation due to rolling increases. For example, the elongated metal plate 64 at least partially has a corrugated shape resulting from a fact that a length in the longitudinal direction D1 varies depending on a position in the width direction D2 as illustrated in FIG. 21. For example, the corrugated shape appears on a side edge 64e of the elongated metal plate 64 extending along the longitudinal direction D1.

Figure 22:
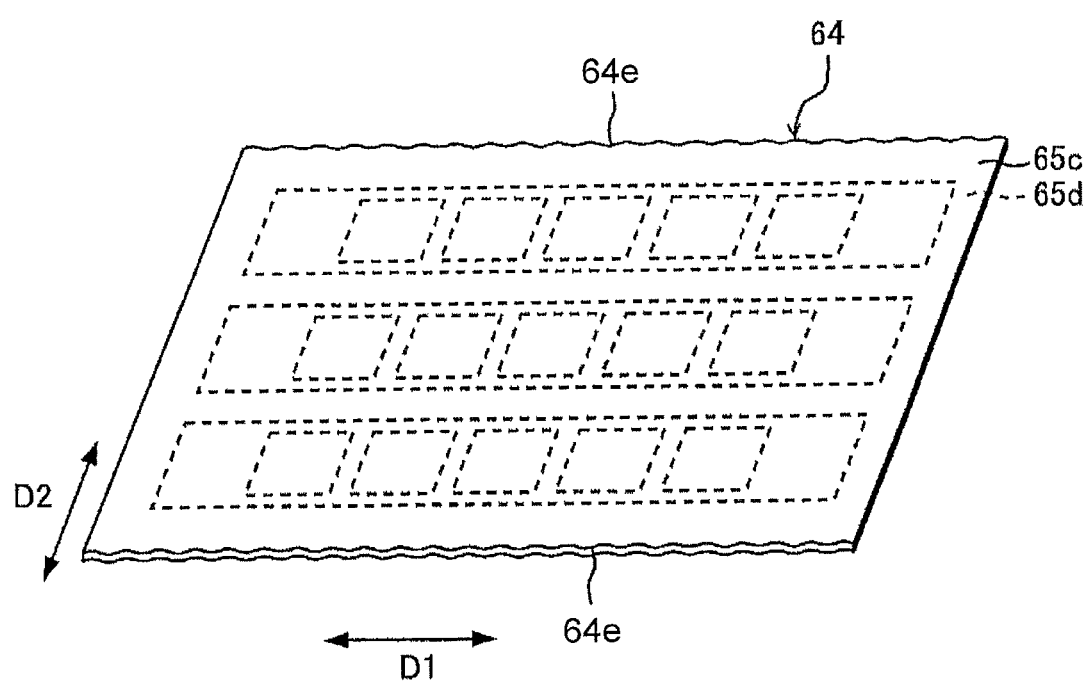
FIG. 22 is a perspective view for describing formation of a deposition mask on the elongated metal plate in which a corrugated shape is compressed to be in a substantially flat state.

Meanwhile, the exposure masks are brought into close contact with the resist films 65c and 65d on the elongated metal plate 64 by vacuum adhesion or the like in the above-described exposure step of exposing the resist films 65c and 65d. Thus, the corrugated shape of the side edge 64e of the elongated metal plate 64 is compressed due to the close contact with the exposure masks as illustrated in FIG. 22, and the elongated metal plate 64 is turned into a substantially flat state. In this state, the resist films 65c and 65d provided on the elongated metal plate 64 are exposed to light in a predetermined pattern as indicated by a dotted line in FIG. 22.

Figure 23:
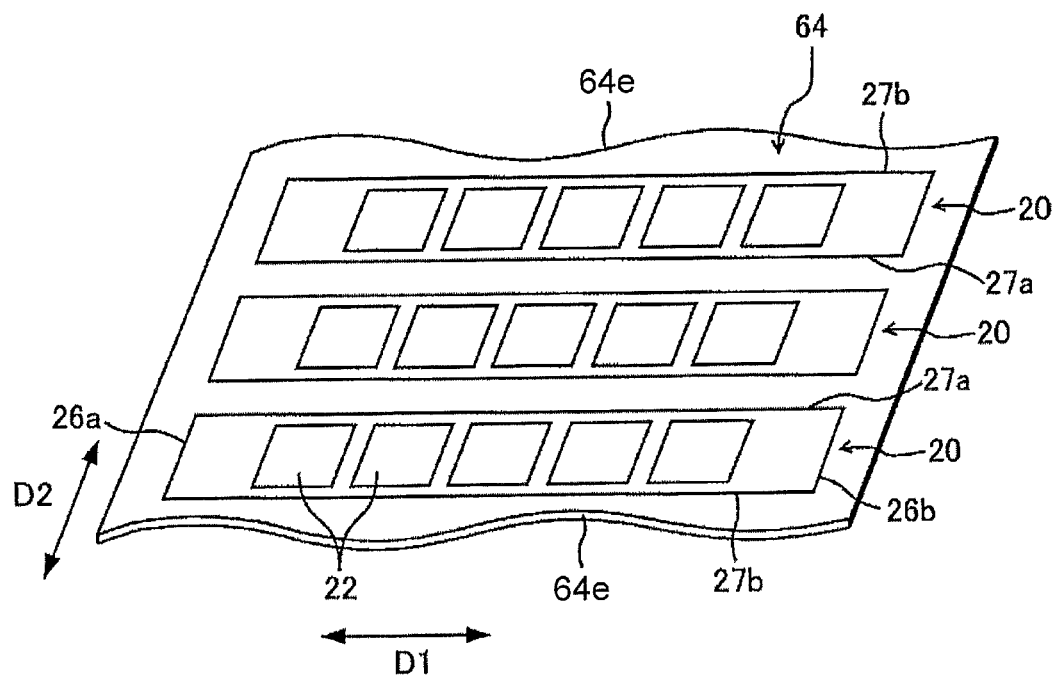
FIG. 23 is a perspective view illustrating a plurality of deposition masks formed on the elongated metal plate.

When the exposure masks are removed from the elongated metal plate 64, the corrugated shape appears again on the side edge 64e of the elongated metal plate 64. FIG. 23 is a view illustrating the elongated metal plate 64 in a state where the plurality of deposition masks 20 are allocated along the width direction D2 by being etched. As illustrated in FIG. 23, the deposition mask 20 facing at least the side edge 64e of the elongated metal plate 64 among the three allocated deposition masks 20 is formed from a portion having a relatively large corrugated shape. In FIG. 23, a reference sign 27a denotes a side edge positioned on the center side of the elongated metal plate 64 (hereinafter referred to as a "first side edge") among side edges of the deposition mask 20 which are allocated so as to face the side edge 64e of the elongated metal plate 64. In addition, a reference sign 27b in FIG. 23 denotes a side edge (hereinafter referred to as a second side edge) positioned on the side opposite to the first side edge 27a and faces the side edge 64e of the elongated metal plate 64. As illustrated in FIG. 23, a portion on the second side edge 27b side in the deposition mask 20 facing the side edge 64e of the elongated metal plate 64 is formed from the portion with a larger corrugated shape than a portion on the first side edge 27a side.

Figure 24:
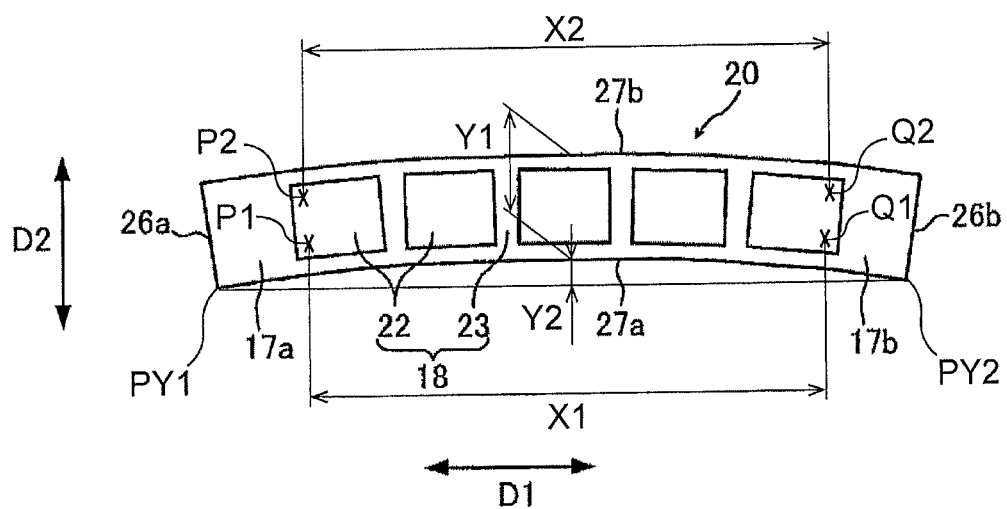
FIG. 24 is a plan view illustrating a deposition mask cut out from the elongated metal plate illustrated in FIG. 23.

FIG. 24 is a plan view illustrating the deposition mask 20 obtained by cutting the deposition mask 20 facing the side edge 64e of the elongated metal plate 64 from the elongated metal plate 64. As described above, when the portion on the second side edge 27b side of the deposition mask 20 is formed from the portion having the larger corrugated shape than the portion on the first side edge 27a side, a length in the longitudinal direction D1 of the portion on the second side edge 27b side is longer than a length in the longitudinal direction D1 of the portion on the first side edge 27a side. That is, the dimension of the second side edge 27b (dimension along the second side edge 27b) in the longitudinal direction D1 is larger than the dimension of the first side edge 27a (dimension along the first side edge 27a). In this case, a curved shape appears in the deposition mask 20 so as to be convex in the direction from the first side edge 27a side to the second side edge 27b side as illustrated in FIG. 24. Hereinafter, such a curved shape is also referred to as a C-shape.

In the present embodiment, the measurement of the dimension X1 and the dimension X2 of the deposition mask 20 is performed without applying a tension to the deposition mask 20. Hereinafter, a quality determination method according to the present embodiment will be described.
(Quality Determination System)

Figure 25:
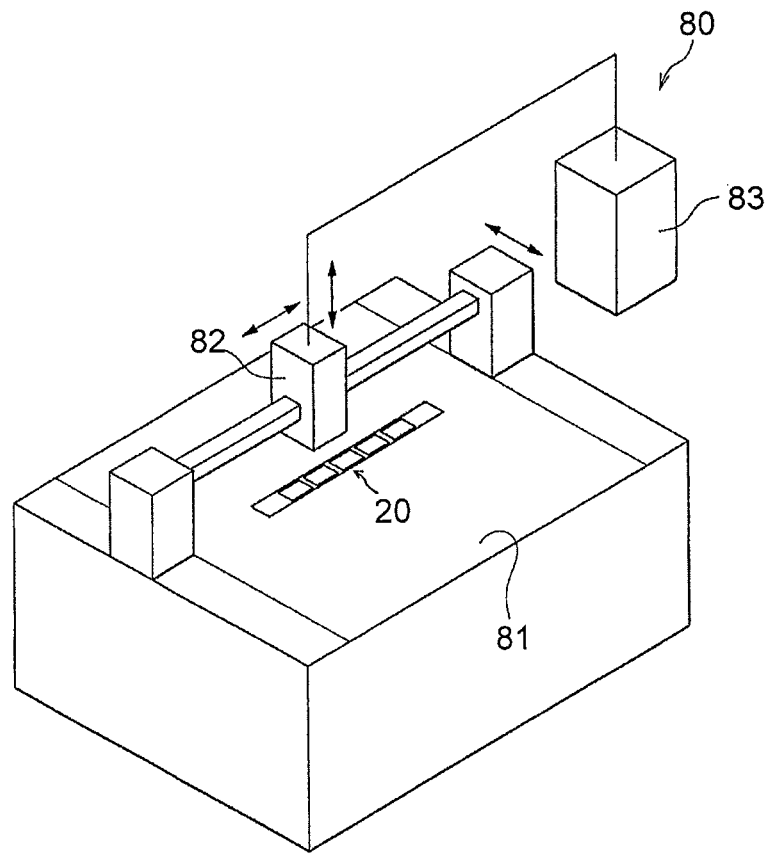
FIG. 25 is a view illustrating an example of a dimension measurement device of a deposition mask.

FIG. 25 is a view illustrating a quality determination system that measures dimensions of the deposition mask 20 to determine good or bad. As illustrated in FIG. 25, a quality determination system 80 includes a stage 81 on which the deposition mask 20 is placed, a dimension measurement device 82, and a determination device 83.

The dimension measurement device 82 includes, for example, a measurement camera (imaging part) that is provided above the stage 81 and images the deposition mask 20 to create an image. At least one of the stage 81 and the dimension measurement device 82 is movable with respect to each other. In the present embodiment, the stage 81 is stationary, and the dimension measurement device 82 is movable in two directions, which are parallel with the stage 81 and orthogonal to each other, and a direction perpendicular to the stage 81. As a result, the dimension measurement device 82 can be moved to a desired position. Incidentally, the quality determination system 80 may be configured such that the dimension measurement device 82 is stationary and the stage 81 is movable.

The measurement of dimensions of the deposition mask 20 can be performed in different methods depending on a size of a portion of the deposition mask 20 serving as an object to be measured.

When the size of the object to be measured is relatively small (for example, several hundred pm or smaller), the object to be measured can be accommodated within the field of view of the measurement camera of the dimension measurement device 82, and thus, dimensions of the object to be measured are measured without moving the measurement camera.

On the other hand, when the size of the object to be measured is relatively large (for example, in the case of being larger than the order of mm), it becomes difficult to accommodate the object to be measured within the field of view of the measurement camera of the dimension measurement device 82, and thus, dimensions of the object to be measured are measured by moving the measurement camera. In this case, the dimension measurement device 82 calculates the dimensions of the deposition mask 20 based on the image captured by the measurement camera and a movement amount of the measurement camera (a movement amount of the stage 81 when moving the stage 81).

The determination device 83 determines whether the above-described Formulas (1) and (2) are satisfied based on the measurement result of the dimension measurement device 82. The determination device 83 includes a computing device and a storage medium. The computing device is, for example, a CPU. The storage medium is, for example, a memory such as a ROM and a RAM. The determination device 83 executes the process of determining the dimensions of the deposition mask 20 by causing the computing device to execute a program stored in the storage medium.
(Dimension Measurement Method)

First, a measurement step of measuring the dimension X1 and the dimension X2 of the deposition mask 20 is performed. In this case, first, the deposition mask 20 is gently placed on the stage 81. At this time, the deposition mask 20 is placed without being fixed to the stage 81. That is, no tension is applied to the deposition mask 20. The deposition mask 20 placed on the stage 81 can be curved in a C-shape as illustrated in FIG. 24, for example.

Subsequently, the dimension X1 and the dimension X2 (see FIG. 24) of the deposition mask 20 on the stage 81 are measured. In this case, the points P1, Q1, P2, and Q2 of the deposition mask 20 are imaged by the above-described measurement camera of the dimension measurement device 82 illustrated in FIG. 25, and coordinates of the points P1, Q1, P2, and Q2 are calculated based on the captured image and the movement amount when the measurement camera has moved. Further, the dimension X1, which is the linear distance from the point P1 to the point Q1, and the dimension X2, which is the linear distance from the point P2 to the point Q2, are calculated based on the calculated coordinates of each point.

(Determination Method)

Next, a determination step is executed to determine whether the calculated dimensions X1 and X2 satisfy the above-described Formulas (1) and (2) based on the measurement result of the dimension measurement device 82. That is, the dimension X1 and the dimension X2 calculated as described above are substituted into the above-described Formula (1), a design value is substituted for $\alpha_X$, and the left side of Formula (1) is calculated as an absolute value. It is determined whether the value on the left side is 40 μm or less. Similarly, the calculated dimension X1 and the calculated dimension X2 are substituted into the above Formula (2), the left side of Formula (2) is calculated as an absolute value, and it is determined whether the value on the left side is 60 μm or less. It is determined that the deposition mask 20 satisfying Formulas (1) and (2) is a non-defective product (pass) and is used in the deposition mask device 10 to be described later.

Method of Manufacturing Deposition Mask Device

Next, a method of manufacturing the deposition mask device 10 using the deposition mask 20 which has been determined to be the non-defective product will be described. In this case, the plurality of deposition masks 20 is stretched to be installed on the frame 15 as illustrated in FIG. 3. More specifically, the tension in the longitudinal direction D1 of the deposition mask 20 is applied to the deposition mask 20, and the ear portions 17a and 17b of the deposition mask 20 in the state where the tension is applied are fixed to the frame 15. The ear portions 17a and 17b are fixed on the frame 15 by, for example, spot welding.

Figure 26:
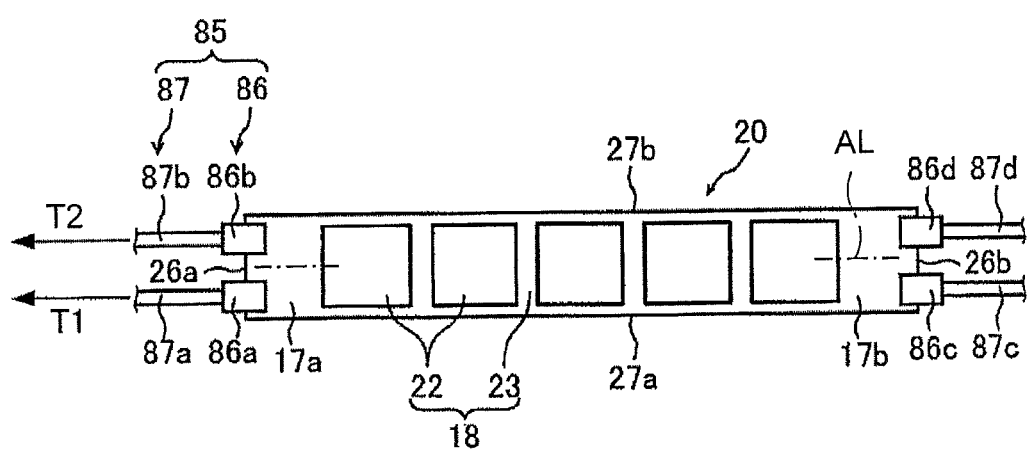
FIG. 26 is a view illustrating an example of a tension applying device.

When the deposition mask 20 is stretched to be installed on the frame 15, the tension in the longitudinal direction D1 is applied to the deposition mask 20. In this case, the first end portion 26a of the deposition mask 20 is gripped by a first clamp 86a and a second clamp 86b arranged on both sides of the central axis line AL, and the second end portion 26b is gripped by a third clamp 86c and a fourth clamp 86d arranged on both sides of the central axis line AL as illustrated in FIG. 26. A first pulling portion 87a is coupled to the first clamp 86a and a second pulling portion 87b is coupled to the second clamp 86b. A third pulling portion 87c is coupled to the third clamp 86c, and a fourth pulling portion 87d is coupled to the fourth clamp 86d. When a tension is applied to the deposition mask 20, the first pulling portion 87a and the second pulling portion 87b are driven to move the first clamp 86a and the second clamp 86b with respect to the third clamp 86c and the fourth clamp 86d, whereby tensions T1 and T2 can be applied to the deposition mask 20 in the longitudinal direction D1. In this case, the tension applied to the deposition mask 20 is a sum of the tension T1 of the first pulling portion 87a and the tension T2 of the second pulling portion 87b. Incidentally, each of the pulling portions 87a to 87d may include, for example, an air cylinder. In addition, the third clamp 86c and the fourth clamp 86d may be made immovable without using the third pulling portion 87c and the fourth pulling portion 87d.

When the tensions T1 and T2 in the longitudinal direction D1 are applied to the deposition mask 20, the deposition mask 20 elongates in the longitudinal direction D1, but shrinks in the width direction D2. At the time of stretching, the tension T1 of the first pulling portion 87a and the tension T2 of the second pulling portion 87b are adjusted such that all the through-holes 25 of the deposition mask 20 which elastically deform in this manner are positioned within an allowable range with respect to desired positions (deposition target positions). Accordingly, the elongation in the longitudinal direction D1 and the shrinkage in the width direction D2 of the deposition mask 20 can be locally adjusted, and each of the through-holes 25 can be positioned within the allowable range. For example, when the deposition mask 20 in a state where no tension is applied is curved in the C-shape so as to be convex in the direction from the first side edge 27a side to the second side edge 27b side as illustrated in FIG. 24, the tension T1 of the first pulling portion 87a on the first side edge 27a side may be made larger than the tension T2 of the second pulling portion 87b. In this manner, it is possible to apply a larger tension to the portion on the first side edge 27a side than to the portion on the second side edge 27b side. Therefore, the portion on the first side edge 27a side can be elongated more than the portion on the second side edge 27b side, and each of the through-holes 25 can be easily positioned within the allowable range. On the contrary, when the deposition mask 20 in a state where tension is not applied is curved in a C shape so as to be convex in a direction from the second side edge 27b side toward the first side edge 27a side, the tension T2 of the second pulling portion 87b on the second side edge 27b side may be made larger than the tension T1 of the first pulling portion 87a. In this manner, it is possible to apply a larger tension to the portion on the second side edge 27b side than to the portion on the first side edge 27a side. Therefore, the portion on the second side edge 27b side can be elongated more than the portion on the first side edge 27a side, and each of the through-holes 25 can be easily positioned within the allowable range.

However, it is considered a case where it is difficult to position each of the through-holes 25 within the allowable range depending on the positional accuracy of the formed through-hole 25 of the deposition mask 20 even when the tension applied to the deposition mask 20 is locally adjusted. For example, when the dimension X1 and the dimension X2 largely deviate from the design values, the elongation in the longitudinal direction D1 of the deposition mask 20 increases so that the shrinkage in the width direction D2 increases or the elongation in the longitudinal direction D1 decreases so that the shrinkage in the width direction D2 decreases. As a result, it is difficult to position each of the through-holes 25 within the allowable range with respect to the desired position (deposition target position) at the time of stretching. Formula (1) is obtained to suppress generation of positional failure of each of the through-holes 25 at the time of stretching due to such a fact.

That is, if the dimensions X1 and X2 of the deposition mask 20 placed stationarily on the stage 81 or the like satisfy Formula (1) as in the present embodiment, it is possible to keep the elongation amount of the deposition mask 20 in the longitudinal direction D1 within a desired range at the time of stretching. Thus, the shrinkage amount in the width direction D2 of the deposition mask 20 at the time of stretching can be kept within a desired range. As a result, when the dimension X1 and the dimension X2 satisfy the formula (1), it is possible to facilitate the position adjustment of each of the through-holes 25 at the time of stretching.

In addition, in general, it is also considered a case where it is difficult to position each of the through-holes 25 at the desired position at the time of stretching depending on the degree of a corrugated shape even when the deposition mask 20 is formed from the elongated metal plate 64 with the corrugated shape formed therein. This is because a longitudinal dimension differs in the width direction D2 due to a difference in the degree of the corrugated shape in the width direction D2 of the elongated metal plate 64. In this case, the dimension X1 and the dimension X2 are different, and the deposition mask 20 can be curved in the C-shape as illustrated in FIG. 24 in the state of being not stretched.

Figure 27:
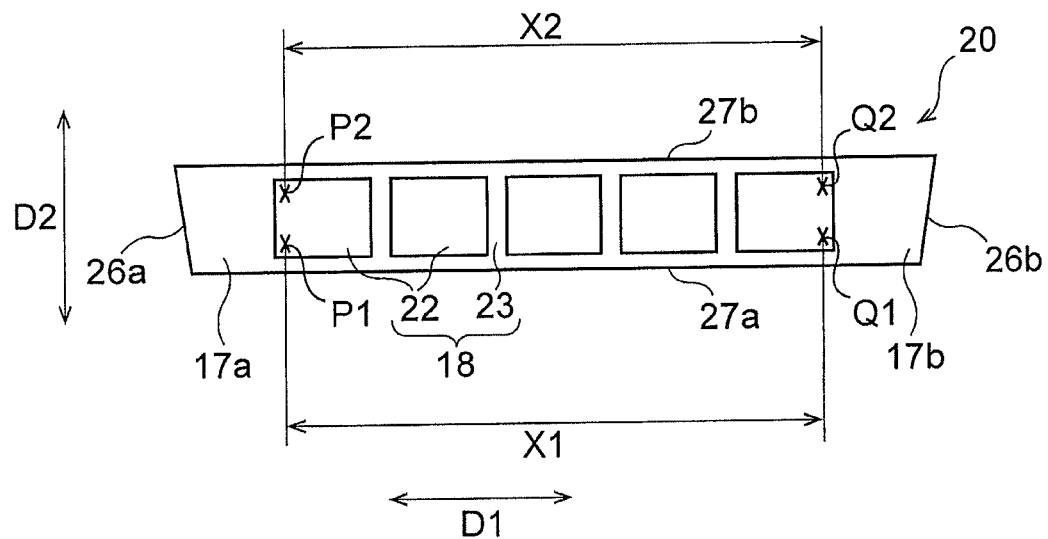
FIG. 27 is a plan view illustrating an example of a stretched state of the deposition mask illustrated in FIG. 24.
Figure 28:
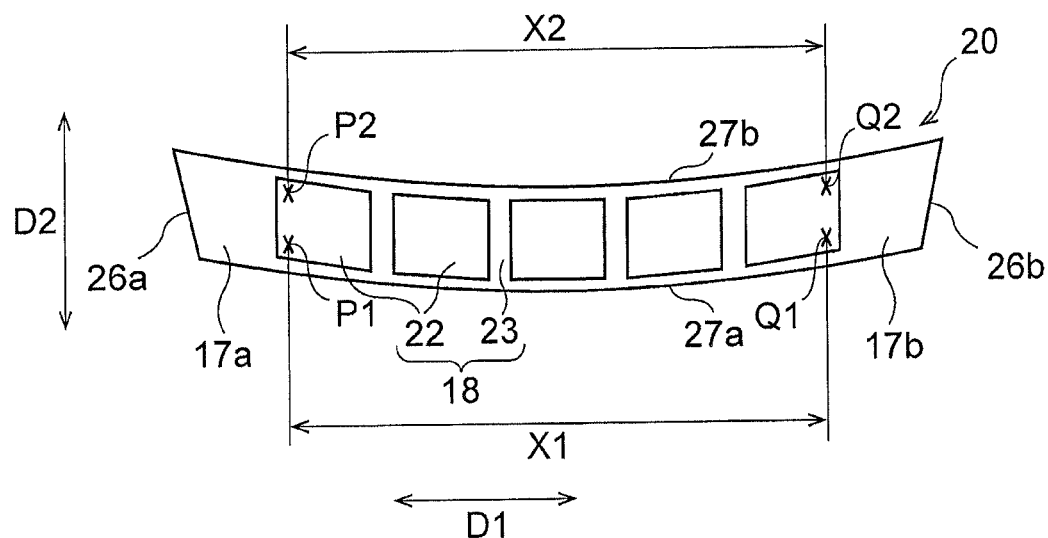
FIG. 28 is a plan view illustrating another example of the stretched state of the deposition mask illustrated in FIG. 24.

For example, in the deposition mask 20 curved as illustrated in FIG. 24, the dimension X1 is shorter than the dimension X2 in a state where the deposition mask 20 is not stretched. Therefore, when the deposition mask 20 is stretched, a tensile force is applied to the deposition mask 20 so that the dimension X1 is equal to the dimension X2 as illustrated in FIG. 27. In this case, the portion on the first side edge 27a side elongates more than the portion on the second side edge 27b side, a central position of the deposition mask 20 in the longitudinal direction D1 is shifted to the first side edge 27a side, and as a result, the through-hole 25 can be displaced in the width direction D2. In addition, there is a case where a curved shape of the deposition mask 20 is reversed as illustrated in FIG. 28 even when the deposition mask 20 is stretched such that the dimension X1 and the dimension X2 are equal to each other. In this case, the first side edge 27a becomes convex and the second side edge 27b is curved to be concave. Even in this case, the through-hole 25 may be displaced in the width direction D2.

In this manner, when the misalignment of the through-hole 25 in the width direction D2 is great, it may be difficult to position all the through-holes 25 within the allowable ranges with respect to the desired positions (deposition target positions). Formula (2) is obtained to suppress generation of positional failure of each of the through-holes 25 at the time of stretching due to such a fact.

That is, if the dimensions X1 and X2 of the deposition mask 20 placed stationarily on the stage 81 or the like satisfy Formula (2) as in the present embodiment, it is possible to prevent the length of the deposition mask 20 in the longitudinal direction D1 from differing in the width direction D2 and to prevent the elongation in the longitudinal direction D1 from differing in the width direction D2 at the time of stretching. Therefore, the misalignment of the through-hole 25 in the width direction D2 can be suppressed at the time of stretching. As a result, when the dimension X1 and the dimension X2 satisfy Formula (2), it is possible to easily position each of the through-holes 25 within the allowable range at the time of stretching.

Deposition Method

Next, a method of depositing the deposition material 98 on the organic EL substrate 92 using the obtained deposition mask device 10 will be described.

In this case, first, the frame 15 is arranged such that the deposition mask 20 faces the organic EL substrate 92 as illustrated in FIG. 1. Subsequently, the deposition mask 20 is brought into close contact with the organic EL substrate 92 by using the magnet 93. Thereafter, in this state, the deposition material 98 is vaporized to cause the deposition material 98 to fly to the organic EL substrate 92 through the through-hole 25 of the deposition mask 20. Accordingly, the deposition material 98 can be attached to the organic EL substrate 92 in a predetermined pattern.

In this manner, according to the present embodiment, the dimension X1 from the point P1 to the point Q1 and the dimension X2 from the point P2 to the point Q2 satisfy the above-described Formulas (1) and (2). As a result, it is possible to reduce the deviation of the dimensions X1 and X2 from the design values in the deposition mask 20 of which the dimension X1 and the dimension X2 satisfy the predetermined conditions and which is determined to be a non-defective product based on Formula (1). Thus, it is possible to cause the shrinkage amount in the width direction D2 to fall within a desired range when stretching the deposition mask 20. In addition, the difference between the dimension X1 and the dimension X2 can be reduced by Formula (2). Thus, it is possible to prevent the elongation in the longitudinal direction D1 of the deposition mask 20 from differing in the width direction D2 at the time of stretching, and it is possible to suppress the misalignment of the through-hole 25 in the width direction D2. As a result, it is possible to improve the positional accuracy of each of the through-holes 25 of the deposition mask 20 in the deposition mask device 10 by producing the deposition mask device 10 using the deposition mask 20 determined to be the non-defective product, and it is possible to improve the positional accuracy of the through-hole 25 at the time of stretching. As a result, it is possible to deposit the deposition material 98 onto the substrate 92 with high positional accuracy, and to manufacture the high-definition organic EL display device 100.

In addition, according to the present embodiment, the points P1 and P2 are positioned at the center points of the corresponding through-holes 25 of the first effective region 22A arranged to be closest to the first ear portion 17a, and the point Q1 and the point Q2 are positioned at the center points of the corresponding through-holes 25 of the second effective region 22B arranged to be closest to the second ear portion 17b. As a result, it is possible to perform quality determination of the deposition mask 20 based on the distance between two points relatively spaced apart from each other in the longitudinal direction D1, thereby improving accuracy in the quality determination of the deposition mask 20.

In addition, according to the present embodiment, the points P1 and P2 are positioned at the center points of the corresponding through-holes 25 formed to be closest to the first ear portion 17a, and the point Q1 and the point Q2 are positioned at the center points of the corresponding through-holes 25 formed to be closest to the second ear portion 17b. As a result, it is possible to perform quality determination of the deposition mask 20 based on the distance between two points spaced apart farther from each other in the longitudinal direction D1, thereby improving accuracy in the quality determination of the deposition mask 20.

Incidentally, it is possible to add various alterations with respect to the embodiment described above. Hereinafter, modified examples will be described with reference to the drawings as necessary. In the following description and drawings to be used in the following description, parts that can be configured in the same manner as the above-described embodiment will be represented by the same reference signs as the reference sings which have been used for the corresponding parts in the above-described embodiment, and the repeated description will be omitted. In addition, when it is apparent that it is possible to obtain the operational effect, which can be obtained in the embodiment described above, even in the modified example, the description thereof will be omitted.

(Modification of Manufacturing Method of Deposition Mask)

Incidentally, the example in which the dimensions of the deposition mask 20 produced by etching the rolled metal plate are measured has been illustrated in the above-described embodiment. However, it is also possible to measure dimensions of the deposition mask 20 manufactured by other methods such as plating by using the dimension measurement method and the quality determination system 80 described above.

(Modification of Dimensions X1 and X2)

Incidentally, the example in which the points P1 and P2 are positioned at the center points of the through-holes 25 formed on the first ear portion 17a side in the first effective region 22A arranged to be closest to the first ear portion 17a side has been illustrated in the above-described embodiment. However, the present invention is not limited thereto, and the through-holes 25 in which the point P1 and the point P2 are positioned may be arbitrary through-holes 25 in the first effective region 22A arranged to be closest to the first ear portion 17a. In addition, the through-holes 25 in which the point P1 and the point P2 are positioned may be the through-holes 25 in the effective region 22 other than the first effective region 22A. The same description is also applied for the points Q1 and Q2. In addition, the point P1 and the point Q1 are not necessarily positioned in the through-holes 25 as long as being arbitrary two points arranged along the longitudinal direction D1 of the deposition mask 20. For example, the point P1 and the point Q1 may be arbitrary concave portions formed on the first surface 20a or the second surface 20b of the deposition mask 20, or may be other through-holes which are not intended to pass through the deposition material 98, or outer dimensions of the deposition mask 20.

EXAMPLES

Next, the present invention will be described more in detail using examples, but the present invention is not limited to the description of the following examples as long as it does not exceed a gist thereof.

The dimensions X1 and X2 were measured for the plurality of produced deposition masks 20. The width dimension of the deposition mask 20 was 67 mm.

First, the deposition mask 20 was placed horizontally on the stage 81 as illustrated in FIG. 25. At that time, the deposition mask 20 was gently placed on the stage 81 so as not to cause a partial recess in the deposition mask 20. Next, the dimension X1 from the point P1 to the point Q1 of the deposition mask 20 was measured, and the dimension X2 from the point P2 to the point Q2 was measured. The measurement results are illustrated in FIG. 29 as $\alpha_x$–X1 and $\alpha_x$–X2. In this case, the points P1 and Q1, and the points P2 and Q2 are set at the centers of the through-holes 25 such that $\alpha_x$ becomes 600 mm. The distance between the point P1 and the point P2 (or the distance between the point Q1 and the point Q2) was 65 mm.

The left side of Formula (1) was calculated by substituting the measured dimension X1 and the measured dimension X2 into the above-described Formula (1). The calculation result is illustrated in FIG. 29 as $|\alpha_x-(X1+X2)/2|$. In FIG. 29, the dimension measurement was performed for the 25 deposition masks 20 obtained from 25 samples, respectively. In Samples 1 to 25, Samples 1 to 10, Sample 21, Sample 22, Sample 24, and Sample 25 satisfied Formula (1) among Samples 1 to 25.

In addition, the left side of Formula (2) was calculated by substituting the dimension X1 and the dimension X2 of the deposition mask 20 into the above-described Formula (2). The calculation result is illustrated in FIG. 29 as $|X1-X2|$. As illustrated in FIG. 29, Samples 1 to 6, Samples 11 to 16, Sample 21, and Sample 23 satisfied Formula (2) among Samples 1 to 25.

Therefore, among Samples 1 to 25, Samples 1 to 6 and Sample 21 satisfied Formulas (1) and (2) and are determined as the deposition mask 20 capable of improving the positional accuracy of the through-hole 25 at the time of stretching as illustrated in the overall determination result in FIG. 29.

Here, a reason why satisfying the above-described Formulas (1) and (2) makes it possible to improve the positional accuracy of the through-hole 25 at the time of stretching will be described.

First, Formula (1) will be described. As described above, Formula (1) is obtained to suppress the generation of positional failure of each of the through-holes 25 at the time of stretching due to the deviation of the dimension X1 and the dimension X2 from the design values. That is, when the dimension X1 and the dimension X2 satisfy Formula (1), it is possible to cause the elongation amount in the longitudinal direction D1 of the deposition mask 20 at the time of stretching to fall within the desired range, and accordingly, it is possible to cause the shrinkage amount in the width direction D2 of the deposition mask 20 at the time of stretching to fall within the desired range. Therefore, attention is paid to a dimension Y1 (see FIG. 24) of the deposition mask 20 at the time of stretching in order to confirm that satisfying Formula (1) contributes to improvement of the positional accuracy of the through-hole 25 at the time of stretching. This dimension Y1 corresponds to a width dimension at the central position in the longitudinal direction D1. The shrinkage amount in the width direction D2 at this central position may be the largest. Incidentally, FIG. 24 illustrates the deposition mask 20 to which no tension is applied, but the dimension Y1 at the time of stretching is illustrated in FIG. 24 for the sake of convenience. The same description is also applied to a dimension Y2 to be described later.

Next, Formula (2) will be described. As described above, Formula (2) is obtained to suppress the generation of the positional failure of each of the through-holes 25 at the time of stretching due to the deviation of the dimension X1 and the dimension X2 from each other. That is, when the dimension X1 and the dimension X2 satisfy Formula (2), it is possible to prevent the elongation in the longitudinal direction D1 from differing in the width direction D2 at the time of stretching and to prevent the misalignment of the through-hole 25 in the width direction D2. Therefore, attention is paid to the dimension Y2 of a recess depth of the first side edge 27a curved in the C-shape of the deposition mask 20 in order to confirm that satisfying Formula (2) contributes to improvement of the positional accuracy of the through-hole 25 at the time of stretching. This dimension Y2 corresponds to the recess depth at the central position in the longitudinal direction D1. More specifically, a dimension from a line segment, which connects an intersection point PY1 between the first end portion 26a of the deposition mask 20 and the first side edge 27a and an intersection point PY2 between the second end portion 26b and the first side edge 27a, to the central position of the first side edge 27a in the longitudinal direction D1 is set as the dimension Y2. Such a dimension Y2 indicates the maximum recess depth of the first side edge 27a. When the curved shape of the deposition mask 20 is reversed at the time of stretching as illustrated in FIG. 28, the dimension Y2 may be set as a recess depth of the second side edge 27b.

Hereinafter, a method of measuring the dimensions Y1 and Y2 will be described.

First, a tension was applied to the deposition mask 20 after completing measurement of the dimensions X1 and X2. More specifically, first, the first end portion 26a and the second end portion 26b of the deposition mask 20 were held by the clamps 86a to 86d as illustrated in FIG. 26, for example, to apply the tension to the deposition mask 20 from the first pulling portion 87a to the fourth pulling portion 87d. The applied tension was set to a force that cause each of the through-holes 25 to be positioned within the allowable range with respect to the desired position (deposition target position) in the longitudinal direction D1. Subsequently, the deposition mask 20 to which the tension was applied was fixed to the stage 81 illustrated in FIG. 25. Next, the dimensions Y1 and Y2 of the deposition mask 20 fixed to the stage 81 were measured. a measurement result of the dimension Y1 is illustrated in FIG. 29 as $\alpha_Y$–Y1. Here, $\alpha_Y$ is a design value of the width of the deposition mask 20 at the central position in the longitudinal direction D1. Incidentally, $\alpha_Y$ is the design value at the time of stretching. In addition, a measurement result of the dimension Y2 is illustrated in FIG. 29 as Y2.

The measured dimensions Y1 and Y2 were evaluated.

Regarding the dimension Y1, evaluation was made based on whether $\alpha_Y$–Y1 is equal to or less than a threshold (±4.0 μm). Here, the threshold is set as a value that allows light emission efficiency of pixels formed by deposition or misalignment within a range in which it is possible to prevent color mixing with pixels of adjacent other colors. Incidentally, when the tension in the longitudinal direction D1 is applied to the deposition mask 20, the width of the deposition mask 20 can be reduced at the central position in the longitudinal direction D1. In this case, the first side edge 27a and the second side edge 27b are deformed so as to approach each other at the central position in the longitudinal direction D1. Therefore, each allowable value of deformation at the first side edge 27a and the second side edge 27b is assumed to be 2 μm, and the threshold is set to ±4.0 μm as a sum thereof. In Samples 1 to 10, Sample 21, Sample 22, Sample 24, and Sample 25 among the samples illustrated in FIG. 29, $\alpha_Y$–Y1 was equal to or less than the threshold. In Samples 1 to 10, Sample 21, Sample 22, Sample 24, and Sample 25, the deviation of the width dimension Y1 of the deposition mask 20 is suppressed, and thus, it is possible to suppress the misalignment of the through-hole 25 in the width direction D2 at the time of stretching. Meanwhile, Samples 1 to 10, Sample 21, Sample 22, Sample 24, and Sample 25 satisfied Formula (1) as described above. Therefore, it can be said that satisfying Formula (1) can improve the positional accuracy of the through-hole 25 at the time of stretching.

In particular, the dimension Y1 indicates the width of the deposition mask 20 at the central position in the longitudinal direction D1. This central position is a position at which the through-hole 25 can be misaligned the most in the width direction D2. Thus, when $\alpha_Y$–Y1 at this central position is equal to or less than the threshold, it can be said that the misalignment of the through-hole 25 in the width direction D2 at a position other than the central position in the longitudinal direction D1 can be further suppressed.

Regarding the dimension Y2, evaluation was made based on whether the dimension Y2 is equal to or less than a threshold (3.0 μm). Here, the threshold is set as a value that allows light emission efficiency of pixels formed by deposition or misalignment within a range in which it is possible to prevent color mixing with pixels of adjacent other colors. In Samples 1 to 6, Samples 11 to 16, Sample 21, and Sample 23 among the samples illustrated in FIG. 29, the dimension Y2 was equal to or less than the threshold. As a result, in Samples 1 to 6, Samples 11 to 16, Sample 21, and Sample 23, the degree of the recess of the first side edge 27a of the deposition mask 20 becomes small, and thus, it is possible to suppress misalignment of the through-hole 25 in the width direction D2 at the time of stretching. Meanwhile, Samples 1 to 6, Samples 11 to 16, Sample 21, Sample 23 satisfied Formula (2) as described above. Therefore, it can be said that satisfying Formula (2) can improve the positional accuracy of the through-hole 25 at the time of stretching.

In particular, the dimension Y2 indicates the depth of the recess of the first side edge 27a of the deposition mask 20 at the central position in the longitudinal direction D1. This central position is a position at which the through-hole 25 can be misaligned the most in the width direction D2. Thus, when the dimension Y2 at this central position is equal to or less than the threshold, it can be said that the misalignment of the through-hole 25 in the width direction D2 at a position other than the central position in the longitudinal direction D1 can be further suppressed.

The invention claimed is:

1. A deposition mask extending in a first direction, the deposition mask comprising:
   a central axis line extending in the first direction and arranged at a central position in a second direction orthogonal to the first direction;
   a point P1 and a point Q1 provided on one side of the central axis line and spaced apart from each other along the first direction;
   a point P2 and a point Q2 provided on the other side of the central axis line and spaced apart from each other along the first direction,
   wherein the point P1 and the point P2 are arranged to be symmetric with each other with respect to the central axis line during deposition, and
   the point Q1 and the point Q2 are arranged to be symmetric with each other with respect to the central axis line during deposition, and
   when a dimension from the point P1 to the point Q1 is X1, a dimension from the point P2 to the point Q2 is X2, and a design value is $\alpha_x$, the deposition mask satisfies the following, $$\left| \alpha_X - \frac{X1 + X2}{2} \right| \leq 40 \text{ μm} \quad \text{[Formula 1]}$$

$$|X1 - X2| \leq 60 \text{ μm} \quad \text{[Formula 2]}$$

wherein
the deposition mask comprises:
   a first ear portion and a second ear portion that form a pair of end portions in the first direction;
   through-holes provided between the first ear portion and the second ear portion; and
   a first edge and a second side edge that form a pair of side edges in a second direction perpendicular to the first direction,
wherein
the point P1 and the point P2 are formed on a side closest to the first ear portion and are positioned at center points of corresponding through-holes,
the point Q1 and the points Q2 are formed on a side closest to the second ear portion and are positioned at center points of corresponding through-holes,
the through-holes corresponding to the point P1 and the point Q1 are formed on a side closest to the first side edge, and
the through-holes corresponding to the point P2 and point Q2 are formed on a side closest to the second side edge.

2. The deposition mask according to claim 1, wherein a plurality of effective regions in which the through-holes are formed is provided between the first ear portion and the second ear portion, the plurality of effective regions includes a first effective region and a second effective region arranged along the first direction of the deposition mask, the first effective region is arranged on the side of the first ear portion, the second effective region is arranged on the side of the second ear portion, the point P1 and the point P2 are positioned at the center points of the corresponding through-holes formed in the first effective region, the point Q1 and the point Q2 are positioned at the center points of the corresponding through-holes formed in the second effective region, the first effective region is arranged on a side closest to the first ear portion among the plurality of effective regions, and the second effective region is arranged on a side closest to the second ear portion among the plurality of effective regions.

3. A method of manufacturing a deposition mask device comprising:

preparing the deposition mask according to claim 1; and applying a tension in the first direction to the deposition mask so that the deposition mask is stretched to be installed to a frame.

\* \* \* \* \*